US006884466B2

(12) United States Patent
Kaloyeros et al.

(10) Patent No.: US 6,884,466 B2
(45) Date of Patent: Apr. 26, 2005

(54) PROCESS FOR LOW-TEMPERATURE METAL-ORGANIC CHEMICAL VAPOR DEPOSITION OF TUNGSTEN NITRIDE AND TUNGSTEN NITRIDE FILMS

(75) Inventors: Alain E. Kaloyeros, Slingerlands, NY (US); Barry C. Arkles, Dresher, PA (US)

(73) Assignees: Gelest, Inc., Morrisville, PA (US); The Research Foundation of State University of New York, Albany, NY (US)

( * ) Notice: Subject to any disclaimer, the term of this patent is extended or adjusted under 35 U.S.C. 154(b) by 0 days.

(21) Appl. No.: 10/425,823

(22) Filed: Apr. 28, 2003

(65) Prior Publication Data

US 2003/0198587 A1 Oct. 23, 2003

Related U.S. Application Data

(63) Continuation of application No. 09/502,260, filed on Feb. 11, 2000, now abandoned.
(60) Provisional application No. 60/119,957, filed on Feb. 12, 1999.

(51) Int. Cl.$^7$ .............................................. C23C 16/34
(52) U.S. Cl. .................... 427/255.392; 427/255.394; 438/680; 438/685
(58) Field of Search .................. 427/255.392, 255.394; 438/680, 685

(56) References Cited

U.S. PATENT DOCUMENTS

| | | | |
|---|---|---|---|
| 1,278,580 A | | 9/1918 | Bosch et al. |
| 2,952,524 A | | 9/1960 | Podall et al. |
| 2,964,387 A | | 12/1960 | Podall et al. |
| 3,100,687 A | | 8/1963 | Wotiz |
| 3,595,616 A | | 7/1971 | Belozersky et al. |
| 3,652,324 A | | 3/1972 | Chu et al. |
| 4,058,430 A | | 11/1977 | Suntola et al. |
| 4,389,973 A | | 6/1983 | Suntola et al. |
| 4,535,000 A | | 8/1985 | Gordon |
| 4,608,271 A | | 8/1986 | Hieber et al. |
| 4,859,617 A | | 8/1989 | Nomoto et al. |
| 4,884,123 A | | 11/1989 | Dixit et al. |
| 4,980,198 A | | 12/1990 | Dowben et al. |
| 4,995,949 A | * | 2/1991 | Rhoades ..................... 205/118 |
| 5,017,403 A | | 5/1991 | Pang et al. |
| 5,077,091 A | | 12/1991 | Nowak et al. |
| 5,085,731 A | | 2/1992 | Norman et al. |
| 5,144,048 A | | 9/1992 | Norman et al. |
| 5,149,514 A | | 9/1992 | Sanjurjo |
| 5,173,327 A | | 12/1992 | Sandhu et al. |
| 5,175,017 A | | 12/1992 | Kobayashi et al. |
| 5,180,512 A | | 1/1993 | Nakatani et al. |
| 5,187,300 A | | 2/1993 | Norman |
| 5,232,872 A | * | 8/1993 | Ohba ........................ 438/648 |
| 5,271,963 A | | 12/1993 | Eichman et al. |
| 5,273,775 A | | 12/1993 | Dyer et al. |
| 5,326,404 A | | 7/1994 | Sato |
| 5,380,678 A | | 1/1995 | Yu et al. |
| 5,393,565 A | | 2/1995 | Suzuki et al. |
| 5,429,989 A | * | 7/1995 | Fiordalice et al. .......... 438/648 |
| 5,487,923 A | | 1/1996 | Min et al. |
| RE35,614 E | | 9/1997 | Norman et al. |
| 5,691,235 A | * | 11/1997 | Meikle et al. ............... 438/680 |
| 5,711,811 A | | 1/1998 | Suntola et al. |
| 5,820,664 A | | 10/1998 | Gardiner et al. |
| 5,919,531 A | | 7/1999 | Arkles et al. |
| 5,972,430 A | | 10/1999 | DiMeo et al. |
| 6,037,001 A | * | 3/2000 | Kaloyeros et al. .......... 427/250 |
| 6,063,179 A | * | 5/2000 | Schmid et al. .............. 106/415 |
| 6,090,709 A | | 7/2000 | Kaloyeros et al. |
| 6,099,903 A | * | 8/2000 | Kaloyeros et al. .......... 427/250 |

(Continued)

FOREIGN PATENT DOCUMENTS

| | | |
|---|---|---|
| DE | 198 53 598 A1 | 2/2000 |
| JP | 62-095823 A | 5/1987 |
| JP | Hei 3-214734 | 9/1991 |
| SU | 450642 A | 3/1975 |

OTHER PUBLICATIONS

Klaus, J.W., et al., "Atomic layer deposition of tungsten nitride films using sequential surface reactions," Journal of the Electrochemical Soc., 147 (3):1175–1181 (2000). (no month avail.).*

Klaus, J.W., et al., "Atomic layer deposition of tungsten and tungsten nitride using sequential surface reactions," AVS 46.sup.th International Symposium, Seattle, WA, abstract TF–TuM6 (1999) (no month avail.).*

A. Jain, et al., "Selective CVD of Copper on Tungsten Versus $SiO_2$ from (B–diketonate) $CuL_n$ Copper (1) Precursors Via $SiO_2$ Surface Modification," Conference Proc. ULSI–VIII (1993) Materials Research Society, pp. 83–89.

(Continued)

Primary Examiner—Bret Chen
(74) Attorney, Agent, or Firm—Akin Gump Strauss Hauer & Feld, LLP

(57) ABSTRACT

Processes for producing tungsten nitride and tungsten nitride films are provided in which a tungsten carbonyl compound and a nitrogen-containing reactant gas are reacted at a temperature below about 600° C. Tungsten nitride precursors are also included which comprise a tungsten carbonyl compound capable of forming a tungsten nitride film in the presence of a nitrogen-containing reactant gas at a temperature of less than about 600° C. A process for forming a film by atomic layer deposition is also provided which includes introducing a substrate having a surface into a deposition chamber and heating the substrate to a temperature sufficient to allow adsorption of a tungsten source precursor or an intermediate thereof, and thereafter sequentially introducing by pulsing: a tungsten source precursor which is absorbed as a monolayer, a purging inert gas, a nitrogen-containing gas for reacting with the monolayer to form a first tungsten nitride layer on the substrate surface, and an inert purging gas, and repeating the sequence to form a film of desired thickness.

17 Claims, 15 Drawing Sheets

U.S. PATENT DOCUMENTS

| | | | |
|---|---|---|---|
| 6,270,572 B1 | | 8/2001 | Kim et al. |
| 6,340,827 B1 | * | 1/2002 | Choi et al. .................. 257/310 |
| 6,376,349 B1 | * | 4/2002 | Tobin et al. ................. 438/592 |
| 6,409,851 B1 | * | 6/2002 | Sethuram et al. ........... 148/565 |
| 6,797,340 B1 | * | 9/2004 | Fang et al. .................. 427/585 |
| 6,821,563 B1 | * | 11/2004 | Yudovsky ................ 427/248.1 |
| 6,833,161 B1 | * | 12/2004 | Wang et al. ................. 427/250 |

OTHER PUBLICATIONS

S.M. Fine, et al., "Consecutive Selective Chemical Vapor Deposition of Copper and Aluminum from Organometallic Precursors," Mat. Res. Soc. Symp. Proc. vol. 282, (1993), pp. 329–334.

A. Jain, et al., "Selective and blanket copper chemical vapor deposition for ultra–large–scale integration", J. Vac. Sci. Technol. B., vol. 11, No. 6 (1993), pp. 2107–2113.

R.V. Joshi et al., "Collimated sputtering of TiN/Ti liners into sub–half–micrometer high aspect ratio contacts/lines," Appl. Phys. Lett. 61 (21), Nov. 23, 1992, pp. 2613–2615.

D. Ugolini et al., "Photoelectron Spectroscopy studies of chemical vapor deposition of Ta from a TaF5 precursor on Si and $SiO_2$ substrates", J. Appl. Phys. vol. 70 (1991), pp. 3899–3906.

Takeo Oku et al., "Thermal Stability of $WN_x$ and $TaN_x$ Diffusion Barriers Between Si and Cu," Jun. 27–29, 1995 VMIC Conference pp. 182–185.

H.O.Pierson, Handbook of Chemical Vapor Deposition, (1992), pp. 98–102, 246–247.

S. Poston, et al., "Density Determination of Silver Neodecanoate, Tungsten Hexacarbonyl, and a Series of Metal Acetylacetonate and Hexafluoroacetylacetonates", J. Electronic Materials. vol. 18, No. 1, (1989), pp. 79–84.

* cited by examiner

PROCESS FOR LOW-TEMPERATURE METAL-ORGANIC CHEMICAL VAPOR DEPOSITION OF TUNGSTEN NITRIDE AND TUNGSTEN NITRIDE FILMS

CROSS-REFERENCE TO RELATED APPLICATIONS

This application is a continuation of U.S. patent application Ser. No. 09/502,260, filed Feb. 11, 2000 now abandoned, further claims the benefit of U.S. Provisional Application No. 60/119,957, filed Feb. 12, 1999, the entire disclosures of these applications are hereby incorporated by reference.

BACKGROUND OF THE INVENTION

As computer chip device dimensions continue their evolution towards feature sizes below 100 nm, new liner materials and associated process technologies are needed to ensure viable diffusion barrier and adhesion promoter performance between the conductor and the surrounding regions of silicon-based and dielectric-based materials. These liners must possess mechanical and structural integrity, good conformality within aggressive device features, high conductivity to minimize plug overall effective resistance, and thermal, mechanical, and electrical compatibility with neighboring conductor and dielectric material systems. Most importantly, liner materials are expected to meet these stringent requirements at increasingly reduced thicknesses, in order to maximize the real estate available for the primary metal conductor within the continuously decreasing device dimensions. In particular, liner thickness is predicted to decrease from 20 nm for the 0.15 $\mu$m device generation, to less than 6 nm for its 0.05 $\mu$m in counterpart as noted in the *International Technology Roadman for Semiconductors*, 1999 Edition, Santa Clara, Calif., pp. 165.

These needs are further complicated by the on-going transition from aluminum-based to copper-based metallization schemes, and requires exploring new candidate liner materials that are chemically and thermodynamically more stable towards copper diffusion and migration than the presently used titanium/titanium nitride materials. These include binary compounds, such as tantalum nitride ($TAN_x$) and tungsten nitride ($WN_x$), and ternary compounds such as tantalum-silicon-nitride ($TaSi_xN_y$) and tungsten-silicon-nitride ($WSi_xN_y$). See, M. Takayama et al., *J. Vac. Sci. Technol.*, B 14, pp. 674 (1996); M. Uekubo et al., *Thin Solid Films*, 286, pp. 170 (1996); and K. Nakajima et al.,*Appl. Surf. Sci.*, 117/118, pp. 312(1997).

Tungsten nitrides are refractory compounds with high densities and exceptional hardness and barrier properties. They are usually regarded as interstitial compounds, i.e., with a range of non-stoichiometric ratios of tungsten and nitrogen atoms. Even so, two simple stoichiometries are often represented, ditungsten nitride and tungsten nitride. Representative properties are as follows:

TABLE A

| Compound | Density (g/cm$^3$) | Lattice Parameter |
|---|---|---|
| $W_2N$ | 12.0–17.7 | 0.412 |
| WN | same as above | 0.289 |

Manufacturing technology for the production of tungsten nitride is accomplished by the nitriding of tungsten with nitrogen or ammonia, often in the presence of hydrogen at temperatures above 600° C. and under pressure. E. Markel et al., *Kirk-Othmer Encyclopedia of Chemical Technology*, "Nitrides," 17, pp. 114 (1996). Manufacturing processes leading to tungsten nitride with more uniform properties and lower process temperatures are desirable since many potential applications for tungsten nitride films are temperature sensitive. For example, in microelectronic applications there is a need for a low temperature process for forming tungsten nitride, since such applications require consistent film properties in order to achieve uniform electrical properties and stress free coatings (uniform lattice parameters or amorphous structure) without damaging structures by exposure to high temperatures or corrosive by-products.

While $WN_x$ presents a potentially viable solution given its attractive properties as highly refractory material with excellent mechanical and chemical properties, there remains problems with achieving high conformality with low impurities. Since tungsten nitride can be deposited in amorphous form (see, B. Park et al., *J. Electron. Mater.*, 26, pp. 1 (1997)), it is highly desirable for microelectronic applications, given that an amorphous film inherently has no grain boundaries. The lack of grain boundaries provides added stability towards metal migration by eliminating grain boundaries as a primary path for metal diffusion. Accordingly, prior work in the literature has successfully demonstrated the applicability of $W_2N$ as an effective barrier against copper diffusion at temperatures as high as 750° C. M. Uekubo et al., *Thin Solid Films*, 286, pp. 170 (1996).

Uekubo, noted above, has deposited tungsten nitride by reactive sputtering. Unfortunately, the application of sputtering techniques is limited by concerns over the ability to provide good conformality in sub-100 nm device structures.

Tungsten nitride has also been deposited by chemical vapor deposition (CVD) from tungsten tetrafluoride ($WF_6$) and ammonia ($NH_3$). S. Marcus et al., *Thin Solid Films*, 236, pp.330 (1993). While such CVD-based methods could provide viable step coverage in such aggressive topographies, thereby allowing the potential use of the same CVD liner technology in multiple generations of sub-100 nm microprocessor and memory products, inorganic CVD from $WF_6$ and $NH_3$ poses challenges. The difficulties include: (a) transport and handling concerns attributed to the high reactivity of the fluorinated $WF_6$ source, (b) process concerns caused by potential gas phase particle generation in the reaction of $WF_6$ and $NH_3$ and (c) reliability issues pertaining to the possible inclusion of fluorine in the resulting $WN_x$ liner which is a fast diffuser in metals such as copper.

M. H. Tsai et al., *Appl. Phys. Letters*, 68, pp. 1412 (1996) also demonstrates a metal-organic CVD (MOCVD) from a single tungsten source, i.e., bis-(tert-butyl-imido)bis (tertbutylamido)tungsten having the formula $((t-BuN)_2W(NHt-Bu)_2)$. MOCVD from such single source precursors typically requires high processing temperatures, in excess of 450° C., with resulting film resistivities generally greater than 620 $\mu\Omega$/cm. Higher resistivities result from significant thermal sensitivity of such single source prior art tungsten precursors for MOCVD. At temperatures of about 450° C. and higher, the hydrocarbon-based ligands in such sources tend to decompose readily, leading to film contamination with carbon and, as a result, higher resistivity.

Such recent attempts to generate $WN_x$ films consistent with microelectronic manufacturing have focused on methods utilizing tungsten hexafluoride as a precursor, with typical process windows for tungsten hexafluoride requiring temperatures greater than 450° C. as noted above with respect to Marcus et al. See also T. Nakajima et al., *J.*

Electrochem. Soc., 134, pp. 3175 (1987). Alternately, plasma methods using tungsten hexafluoride have been used, but these still require temperatures greater than 350° C. See C. Meunier et al., *Mater. Manufacturing Process.*, 13, pp. 415 (1998) and J. P. Lu et al., *J. Electrochem. Soc.*, 145(2), pp. L21 (1998). Both the tungsten hexafluoride and plasma methods share the corrosive by-products of ammonium fluoride and hydrogen fluoride which cannot only react with tungsten nitride, but also with other metals and dielectrics which are typically part of microelectronic structures, for example, silicon, silicon dioxide, and aluminum. Fluorine is also a fast diffuser in copper. The direct erosion of silicon by tungsten hexafluoride has also been reported. D. Baxter et al., *Chem. Mater.*, 8, pp. 1222 (1996).

Attempts to use organic-tungsten compounds to produce tungsten nitride films involve precursors which, under the best reported conditions invariably incorporate carbon into the films and have not shown low resistivities. M. Tsai et al., *Appl. Phys. Lett.*, 68, pp. 1412 (1996). Dimethylamido-substituted tungsten compounds have been shown in model studies not to be stable enough to volatilize or undergo transport without vapor phase particle formation, which is inconsistent with the formation of uniform coatings. See, Baxter, above.

Furthermore, as device sizes continue their trend towards smaller features, tungsten nitride liner materials must provide the required performance at continuously reduced thicknesses in order to maximize space availability for the actual copper conductor. Predictions published in the International Technology Roadmap for Semiconductors-1998 Update indicate the need for liners with thicknesses below 1 nm for the 50 nm node. These trends require the development and optimization of manufacturing-worthy processes for the reliable and reproducible deposition of conformal ultrathin liners with atomic level controllability. As a result, work in the prior art has demonstrated that techniques such as atomic layer CVD (ALCVD) and atomic layer deposition (ALD) are viable candidates for incorporation in sub-tenth-micron semiconductor device fabrication flows. DiMeo, Jr., et al., U.S. Pat. No. 5,972,430; Suntola et al., U.S. Pat. No. 5,711,811; Suntola et al., U.S. Pat. No. 4,389,973; and Suntola, et al., U.S. Pat. No. 4,058,430.

These techniques are almost universally based on the principle of self-limiting adsorption of individual monolayers of source precursor species on the substrate surface, followed by reaction with appropriately selected reactants to grow a single molecular layer of the desired material. Thicker films are produced through repeated growth cycles until the desired target thickness is met. Unfortunately, the ALCVD approaches described in the prior art have not successfully reported the growth of $WN_x$ films with electronic grade quality for microelectronics applications, in part due to the lack of an appropriate metal-organic source chemistry which is amenable to the self-limiting adsorption in monolayer form on the substrate surface. In addition, the high chemical and thermal instability of many of the metal-organic tungsten source precursors used in the prior art can cause premature decomposition of the source chemistry upon contact with the substrate surface. The net outcome is the growth of highly contaminated films via a more conventional CVD-based thermolytic or pyrolytic approach, instead of the self-limiting, layer-by-layer, ALD approach. Even in the case of the inorganic tungsten hexafluoride source chemistry, there has not been a successful identification of an appropriate process window and/or intermediate precursor species that can successfully and reliably allow adsorption and decomposition in a layer-by-layer ALD mode.

Accordingly, there is a need in the art for a method for producing tungsten nitride and tungsten nitride films for use in a variety of applications, and in particular for microelectronic applications which provides good conformality, does not have difficulties in transport or handling, does not lead to significant gas phase particle generation from reaction of the precursor(s) used with the nitrogen source and which avoids inclusion of corrosive materials such as fluorine in the resulting tungsten nitride liner which may diffuse rapidly in metals in microelectronic applications such as copper. There is further a need for such a method which can produce tungsten nitride and tungsten nitride films with low or no carbon impurities in the resulting materials and which produce sufficient resistivities. There is also a need in the art for a method to produce films, including tungsten nitride films, of increasingly smaller thicknesses while retaining high conformality and uniformity.

There is further a need in the art to develop chemically-engineered, highly maleable tungsten source precursors for incorporation in atomically-tailored, interfacially-engineered, CVD processes for the deposition of highly conformal ultrathin tungsten nitride films, as thin as a few monolayers. Further, it would be desirable if these atomic-layer CVD (ALCVD) processes were able to demonstrate the necessary ability to chemically and structurally "nano-engineer" the substrate surface through tightly controlled interactions with the chemically-engineered source precursors or appropriate source precursor intermediates to allow sequential atomic layer by atomic layer growth of films such as tungsten nitride.

BRIEF SUMMARY OF THE INVENTION

The invention includes a process for the production of tungsten nitride, comprising reacting a tungsten carbonyl compound with ammonia at a temperature below about 600° C. In one embodiment of the process, the tungsten carbonyl compound is a compound according to formula (I):

$$W(CO)_{(6-n)}X_n \qquad (I)$$

wherein X is a two-electron donor or a ligand selected from the group consisting of ammonia, amine, carbonyl and halogen and n is 0 or 1.

The invention further includes a process for the production of a tungsten nitride film comprising reacting a tungsten carbonyl compound with ammonia at a temperature below about 600° C.

A process for the chemical vapor deposition of a tungsten nitride film onto a substrate is also within the invention. The method comprises introducing into a deposition chamber, a substrate, a tungsten carbonyl compound in a vapor state and at least one nitrogen-containing gas, and maintaining a substrate temperature of from about 200° C. to about 600° C. for a period of time sufficient to deposit a tungsten nitride film on the substrate.

A tungsten nitride precursor is further included in the invention which precursor comprises a tungsten carbonyl compound, and the precursor is capable of forming a tungsten nitride film in the presence of a nitrogen-containing reactant gas at a temperature of less than about 600° C.

The invention also includes a tungsten nitride film having an electrical resistance of less than about 600 $\mu\Omega$/cm, wherein the film is a reaction product of a tungsten carbonyl compound and a nitrogen-containing gas.

A tungsten nitride coated substrate is also within the invention and it comprises a substrate coated on at least one side with a tungsten nitride film, wherein the tungsten nitride film has an electrical resistance of less than about 600 μΩ/cm and is a reaction product of a tungsten carbonyl compound and a nitrogen-containing gas.

A process for forming a film by atomic layer deposition is also encompassed within the invention and includes introducing into a deposition chamber a substrate having a surface and heating the substrate to a temperature sufficient to allow adsorption of a tungsten source precursor or an intermediate of a tungsten source precursor. A tungsten source precursor is introduced into the deposition chamber by pulsing the tungsten source precursor to expose the heated substrate surface to the tungsten source precursor for a period of time to form a self-limiting monolayer of the source precursor or an intermediate of the tungsten source precursor intermediate on the substrate surface. An inert gas is introduced into the deposition chamber by pulsing the inert gas to purge the deposition chamber with an inert gas for a period of time sufficient to remove the tungsten nitride precursor in the gas phase but without removing adsorption precursor in the monolayer. A nitrogen-containing gas is introduced into the deposition chamber by pulsing the nitrogen containing gas for a period sufficient to react with the adsorbed precursor monolayer on the substrate surface and to form a first tungsten nitride atomic layer on the substrate surface. In a preferred embodiment, the process for forming a film by atomic layer deposition, further comprises introducing an inert gas by pulsing the inert gas into the deposition chamber to purge the deposition chamber of nitrogen-containing reactant gas. The process for forming a film by atomic layer deposition as described above is repeated by pulsing in further precursor, then inert gas, then nitrogen-containing reactant gas in the manner noted above until the tungsten nitride film of a predetermined thickness is formed.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
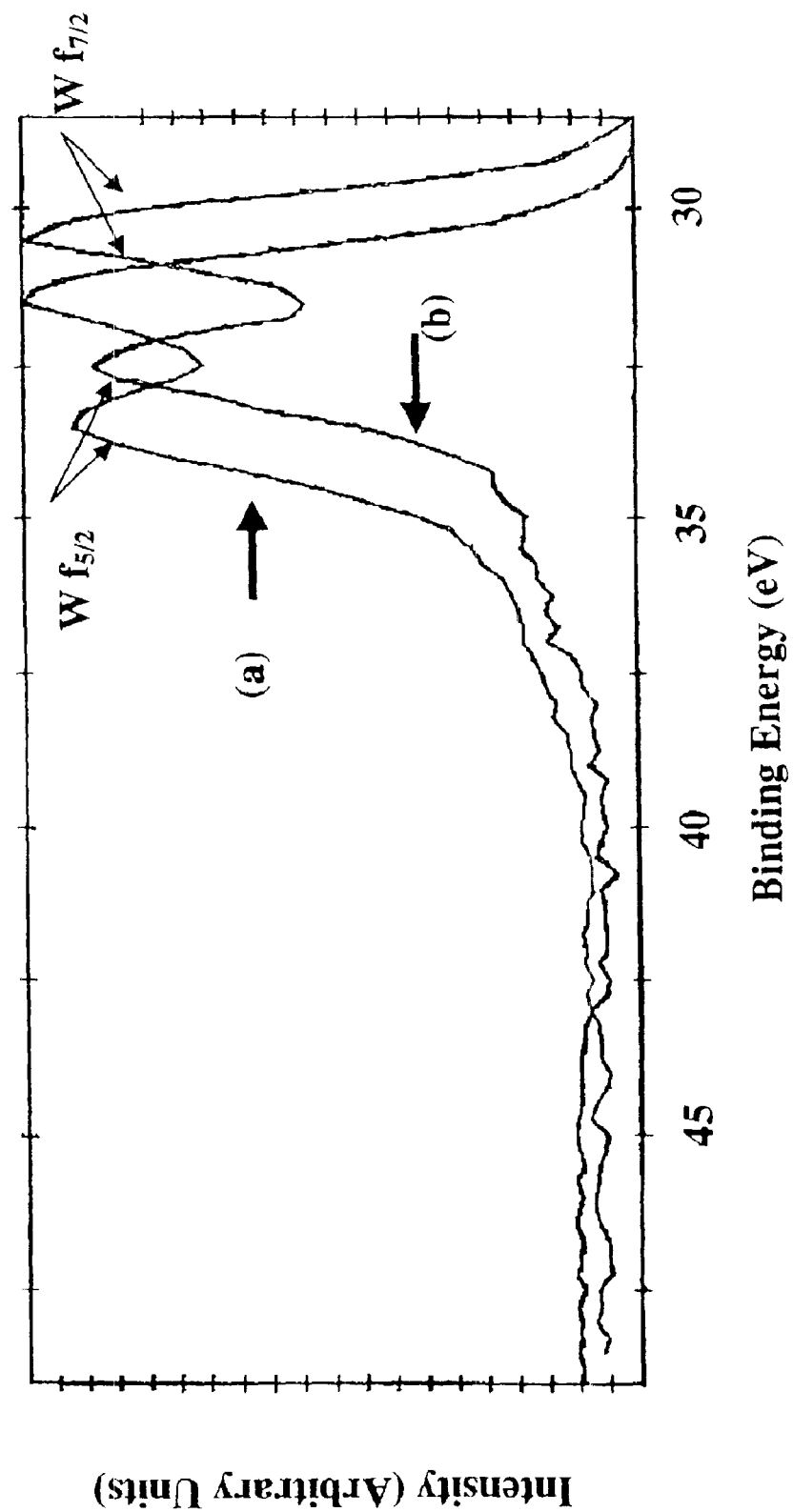
FIG. 1 is a representation of high resolution x-ray photoelectron spectroscopy (XPS) spectra of the W4f$_{7/2}$ elemental core peaks for (a) metal-organic chemical vapor deposition (MOCVD) W$_2$N films formed in accordance with an embodiment of the process of the invention in Example 1 and (b) a sputtered pure W standard.

The tungsten nitride and tungsten nitride films of the present invention and the tungsten nitride precursors of the invention may be used on a wide variety of substrates and for a wide variety of applications. While they, of course, are highly applicable in the microelectronic field, deposited thin films of tungsten nitride in accordance with the invention also form hard coatings which may be used as protective coatings in various fields such as for providing hard coatings to aircraft or other engine parts or as a substitute for silicon nitride or tungsten carbide in many applications in which such coatings are used. For example, such tungsten nitride films may be used for hard coatings on drill bits to protect the life of the drill bit in place of tungsten carbide and similar drill bit coating materials. Further, other tools, which are now provided with protective coatings, or materials which are formed of tungsten carbide, but are still vulnerable to oxidation can be coated with the tungsten nitride films of the invention to extend their life. The tungsten nitride of the invention may also be used s a cosmetic and/or protective coating for jewelry, in anti-reflective coatings for optical, optoelectronic, and lithography applications. In addition, light bulb filaments may be coated with the tungsten nitride films of the invention in order to extend filament life.

The tungsten nitride films of the invention are more advantageous than tungsten carbide for applications such as those mentioned above, because the tungsten nitride films of the invention can be formed as amorphous films with little or no polycrystallinity. As a result, such films do not oxidize as quickly as tungsten carbide. In addition, the tungsten nitride films emit light from a different part of the spectrum than materials such as tungsten carbide and appear more gold than black in appearance. As a result of the unique emission spectrum of the films, such films are more thermodynamically efficient and do not absorb heat as quickly from the environment. Such efficiency is particularly advantageous in applications in which heat is detrimental and can lead to failure, such as in many microelectronic applications and in light bulb filaments where heat contributes to filament failure. While such intended applications clearly benefit from the tungsten nitride, tungsten nitride films and film forming processes of the present invention, it will be understood, based on this disclosure that such films have a wide range of potential uses and will provide significant advantages in many fields. As a result, while the tungsten nitride and tungsten nitride films and processes are generally described herein with respect to their potential use in microelectronics, such uses should not be considered limiting in any regard.

The invention includes processes for producing tungsten nitride and tungsten nitride films as well as a process for the chemical vapor deposition of tungsten nitride films onto a substrate. The invention further includes tungsten nitride precursors capable of forming a tungsten nitride film and a tungsten nitride coated substrate. Such tungsten nitride films, as well as other thin films, may further be produced in accordance with the process for producing a film by atomic layer deposition of the invention.

In all embodiments of the invention herein described, tungsten nitride is formed by reacting a tungsten carbonyl compound with a nitrogen-containing reactant gas such as preferably ammonia, and at a preferred temperature of less than about 600° C. The tungsten nitride can have tungsten and nitrogen in varied stoichiometric ratios, but preferably includes tungsten nitride in the form of $WN_x$, wherein x is preferably characterized by the relationship, $0.1 \leq x \leq 2.0$. However, it is within the scope of the invention to vary the ratio of tungsten to nitrogen in the final films by varying the concentration of the reactants with respect to each other. Preferably, the ratio of gaseous flow of nitrogen containing reactant to the tungsten source precursor ranges from about 1000:1 to about 1:1000, more preferably from about 100:1 to about 1:1 and most preferably from about 2:1 to about 1:1, however, it will be understood that the range of ratios for the precursors also is related to the desired W:N ratio desired in the resulting film for a given application.

The tungsten carbonyl compound used in the invention may be any $W^0$ complex of carbonyl (CO) with tungsten (W) which is preferably free of fluorine, including most preferably tungsten hexacarbonyl also known as hexacarbonyl tungsten, i.e. $(W(CO)_6)$. However, one or more of the carbonyl groups may also be substituted with electron pair donors or similar ligands. Tungsten hexacarbonyl has the following properties: a melting point of 169–170° C.; a vapor pressure at 35° C. of 2 torr; a $\Delta H_{form}$ of −227 kcal/mole; and a specific gravity of 2.65. Tungsten hexacarbonyl is available as a white, odorless powder which is stable in air and which has a toxicity level (oral in rats) of LD50:>5000 mg/kg. In the tungsten carbonyl compounds of the invention, one of the carbonyl groups is readily substituted with groups or elements such as ammonia, amine, halogens and electron pair donors such as oxygen compounds and the like which may be used to assist in transport of the tungsten carbonyl compound to the deposition area as described further below. In addition, the carbonyl groups are readily substituted by nitrogen in the processes of the present invention, particularly in the CVD processes of the invention.

In preferred embodiments of the invention, the tungsten carbonyl compound has the following formula (I):

$$W(CO)_{(6-n)}X_n \qquad (I)$$

wherein X is a two-electron donor or a ligand such as ammonia, amine, carbonyl and halogens such as chlorine, bromine and iodine. In addition, X may be oxygen-containing organics such as tetrahydrofuran, trimethyphosphine and compounds of similar structure which can act as two-electron donor compounds While fluorine may be used, it is not preferred due to its high reactivity. Any other similar groups which may be easily displaced by nitrogen in the deposition process but which do not have a significant adverse affect on the formation of tungsten nitride may also be used as the ligand X. In formula (I), n is preferably 0 or 1.

Tungsten nitride formed from reacting tungsten carbonyl compounds such as those described above with a nitrogen-containing gas such as nitrogen, ammonia, and hydrazine, most preferably ammonia at a temperature below 600° C. are within the scope of the invention. Tungsten nitride, preferably of the stoichiometry $WN_x$ with $0.1 \leq x \leq 2.0$, are formed by reacting the tungsten carbonyl compound and nitrogen-containing gas, preferably ammonia, and more preferably, in the presence of hydrogen. Hydrogen when employed assists in the decomposition process of the tungsten nitride precursor, i.e., the tungsten carbonyl compound. In addition, the use of hydrogen can aid in removal of (CO) ligands from the tungsten carbonyl compound by bonding with the ligands once they are dissociated from the decomposing tungsten carbonyl compound. By bonding with such ligands, the hydrogen can aid in preventing their reincorporation in the resulting tungsten nitride film, thereby minimizing potential contaminants in the resulting film.

An example of the reaction of a tungsten carbonyl compound and the nitrogen-containing reactant gas, for example tungsten hexacarbonyl and ammonia proceeds as follows:

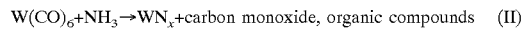
$$W(CO)_6 + NH_3 \rightarrow WN_x + \text{carbon monoxide, organic compounds} \qquad (II)$$

and nitrogen-containing compounds (II)

A further example of a reaction in accordance with the present invention using a tungsten carbonyl compound and a nitrogen-containing reactant gas in the presence of hydrogen, such as tungsten hexacarbonyl and ammonia with hydrogen, proceeds as follows:

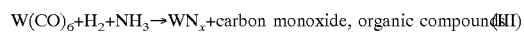
$$W(CO)_6 + H_2 + NH_3 \rightarrow WN_x + \text{carbon monoxide, organic compounds} \qquad (III)$$

and nitrogen-containing compounds

In the case of thermolysis or pyrolysis of tungsten hexacarbonyl without the presence of a nitrogen-containing gas or hydrogen, an exemplary reaction proceeds as follows:

$$W(CO)_6 \rightarrow W(C, O, CO) \qquad (IV)$$

In the above formula, CO, C and O may range from 5 at % to more than 50% depending upon the substrate temperature, with higher substrate temperatures yielding lower CO, O, and C incorporation. As such, the production of hydrogenated and nitride byproducts in formulas (III) and (II) are critical to the growth of pure tungsten nitride films without CO, C or O contamination.

In order to form tungsten nitride in accordance with the process of the present invention, it is preferred that the temperature be kept within the range of from about 200° C. to about 350° C. in order to receive the most benefits of the low temperature advantages of the present invention. Further, the lower the temperature within this range, the lower the level of polycrystallinity, and, in accordance with one preferred embodiment of the invention, tungsten nitride formed using the specified reaction at temperatures of from about 200° C. to about 275° C. form a substantially completely, if not completely, amorphous phase tungsten nitride.

The tungsten carbonyl compounds described above which are capable of forming a tungsten nitride film in the presence of a nitrogen-containing reactant gas such as ammonia at the temperatures noted above further provide unique precursors for the formation of tungsten nitride and tungsten nitride films, particularly in accordance with various deposition processes as described further below. The tungsten nitride films formed in accordance with this invention demonstrate low resistivities of less than about 600 $\mu\Omega$/cm, preferably less than about 400 $\mu\Omega$/cm and most preferably less than 300 $\mu\Omega$/cm at temperatures below about 600° C.

The tungsten nitride films of the invention may be formed in accordance with any suitable method, preferably a CVD method and using any of a wide number of commercially available or specially modified sputtering or other CVD apparatuses, as described further below. While the present invention is described in terms generally of CVD methods of forming tungsten nitride, since such methods are preferred, it will be understood based on this disclosure that tungsten nitride generally for a wide variety of applications and for coatings and films can be formed using other suitable pathways, including sputtering, collimated sputtering, nitridation from the liquid phase, annealing of tungsten films in a nitrogen-containing ambient, ion-beam deposition, and laser ablation.

While specific, preferred methods are described herein, it will be understood, based on this disclosure, that other apparatuses and other CVD methods capable of forming tungsten nitride films from the tungsten nitride precursors of the invention and which are capable of carrying out the claimed processes are within the scope of the invention.

Formation of tungsten nitride and deposition of tungsten nitride films occurs generally in accordance with the invention by heating one or more tungsten carbonyl compounds to temperatures in the range of from about 85° C. to about 100° C. and transporting the tungsten carbonyl compound(s) preferably by a mass flow device into a deposition chamber which preferably has a substrate for receiving the tungsten nitride reactant product. If a transport gas is used, as described further below, such as hydrogen, the tungsten carbonyl compound(s) may be transported first to a mixing zone in which the hydrogen, or other gas, is mixed into the tungsten carbonyl compound(s) which act as a precursor(s). The reaction chamber preferably contains a substrate at a temperature of less than about 600° C., preferably from about 200° C. to about 350° C. and most preferably not greater than about 275° C. Ammonia, or another nitrogen-containing reactant gas is introduced into the deposition chamber. Molar equivalents of ammonia or other reactants are provided which would displace one of the carbonyl groups on the molecule of the tungsten carbonyl compound precursor(s), and can be introduced into the mixing zone before the reaction chamber in order to receive the benefit of prereaction and to increase deposition rate, however, caution must be taken as such benefits may be offset by vapor phase particle formation if mixing is poor.

Use of the tungsten nitride source precursor of the invention provides a tungsten nitride growth process which is relatively independent of the type of substrate used. This is desirable because more selective tungsten nitride CVD processes available in the prior art are not feasible within the constraints imposed by prevailing manufacturing practices, particularly with respect to the need for ultra clean room sample preparation and associated processing conditions to ensure selectivity.

The precursors may be used to provide conformal tungsten nitride films on various substrates, including blanket substrates (non-patterned) and patterned substrates which have sub-micron features and structures. The films are useful on such substrates as a result of their ability to completely fill the aggressive device features of emerging integrated circuitry technologies and for their ability to form a hard, protective coating. In microelectronic applications, such films may be used as resistant barrier layers and/or adhesion promotor layers for copper metallization schemes in which copper films act as signal-carrying conductors across each metallization level in a computer chip (interconnects) or as barrier materials and/or adhesion promoters in copper metallization schemes having signal-carrying conductors that connect two different levels in a computer chip (plug). The conformal films are also useful in applications involving the deposition of metals by plating techniques, including deposition of metals by electroless plating in which such protective or barrier coatings are desired to protect the metals coated on a surface, to protect a surface from an outer coating as a liner or barrier, or to provide interlayer protection between layers in multilayer coatings or multilayer plating.

As used herein, "conformal" coating means a coating which evenly covers a substrate having a complex topography. The evenness of the coating can be measured by, for example, examining the thickness of the coating along the walls and bottom of the hole in the substrate, and determining the variation in the thickness of the coating. According to the invention, sub-quarter-micron substrates are conformally coated when the coating has a thickness, measured at any point normal to the surface of a wall or floor of a hole in the surface of the substrate, which is within 25% of the thickness at any other point in the hole. Preferably, the variation of coating thickness of tungsten nitride films formed using the precursors of the invention is within 10%, and more preferably within 5%, that is, at no point is the thickness of the coating either 10% or preferably 5% greater or smaller than the average coating thickness.

As used herein, "step coverage," particularly with respect to ULSI devices and coated substrates therein, refers to the ratio of the coating thickness at the bottom of a feature such as a trench or via, to the thickness of the coating on the top surface of the substrate adjacent to the feature, where the ratio is multiplied by 100 to provide a percentage value. The processes of the invention and deposited tungsten nitride films formed from the precursors of the invention have conformal or complete filling of complex substrate topographies depending on the intended use of the substrate.

While the substrate is not limited, preferred substrates which may be coated with the tungsten nitride films of the present invention are those which are intended to be used in an integrated circuit and which have complex topography including holes, trenches, vias and the like for providing the necessary connections between materials of various electrical conductivities that form a semiconductor device. Other substrates which may be used with the tungsten nitride films are those which are intended for ultra-large scale integration (ULSI) integrated circuit technologies and are also patterned with holes, trenches, and other features with diameters of less than 1.0 micron, and often less than 0.5 microns, and even 0.25 microns or less. Such substrates having such small features are known as "sub-quarter-micron" substrates. Sub-quarter-micron substrates which may have tungsten nitride barrier and/or adhesion promotor type films deposited on them in accordance with the present invention include those having features with high aspect ratios of from about 3:1 to about 6:1 or more, where the aspect ratio is defined as the ratio of the depth of a feature to its diameter as viewed in cross-section. In this disclosure, "sub-quarter-micron substrates" have feature diameters less than about 0.25 microns and an aspect ratio of typically larger than about 3:1. Those of aspect ratios of about 4:1 and greater are associated with substrates for ULSI circuitry.

Exemplary substrate types which may be coated with deposited tungsten nitride films of the present invention include blanket and patterned semiconductor substrates, such as silicon and gallium arsenide; substrates already coated with single or multilayer metallic coatings; surfaces requiring a hard protective coating; and substrates which require an adhesion promotor or barrier layer or which may also be further coated with other tungsten nitride films formed using the invention. Suitable substrates for receiving the films include, for example, steel, tungsten carbide, silicon nitride, as well as typical microelectronic application metals such as copper (Cu), tungsten (W), tantalum (Ta), titanium (Ti) and their binary, ternary and quaternary phases, such as a further layer of tungsten nitride ($WN_x$) having the same or a different value of x, tantalum nitride ($TaN_x$), titanium nitride ($TiN_x$), titanium-nitride-silicide ($TiN_xSi_y$) and tantalum nitride silicide ($TaN_xSi_y$) where x and y may have values ranging from, respectively, 0 to 2 and 0 to 3, preferably with respect to tungsten nitride, x is from 0.1 to 2.0.

Other substrates which may be coated with tungsten nitride deposited films of the invention and formed from the novel precursors of the invention include silicon dioxide, silicon nitride, or doped versions and mixtures thereof; low dielectric constant (k) insulator materials having K<4.0, which are potential substitutes for silicon dioxide in emerging ULSI circuitry; titanium-based and tantalum-based diffusion barriers or adhesion promoter liners as well as other tungsten-based diffusion barriers or adhesion promotor liners, including those of pure tantalum, tungsten and titanium and their binary, ternary and quaternary alloys; metals, such as aluminum, beryllium, cadmium, cerium, chromium, cobalt, tungsten, gallium, gold, lead, manganese, molybdenum, nickel, palladium, platinum, rhenium, rhodium, silver, stainless steel, iron, strontium, tin, titanium, zinc, zirconium, and alloys and compounds thereof such as suicides, carbides, and nitrides; glass; plastic; or other polymers for applications including automotive or aircraft parts and engines, cutting tools, cosmetic coatings for jewelry, light bulb filaments and multilayered films for flat panel display, solar cell devices, and optoelectronic applications.

It should be understood, based on this disclosure that other substrates may be used within the scope of the invention which would benefit from the application of a tungsten nitride films according to the invention. However, it is preferred that the substrate used with the precursor of the present invention be stable at the conditions as described herein for depositing tungsten nitride films on a particular substrate. As such, substrates should preferably be stable at temperatures up to about 600° C., depending on the intended use of the substrate.

The tungsten nitride films may be deposited first and then coated by deposition with other coatings such as metallic coatings or the tungsten nitride films may be deposited on a substrate or coated substrate such as a substrate having a metallic coating(s). In addition, the films of the invention may be deposited in any sequence or alternately layered. Such depositions may be performed ex situ, in different reactors, or in situ, either in the same reactor (a stand alone reactor) or in two or more separate reactors (for example, a cluster tool), each for deposition of one of the multilayered metallic coatings. If one reactor is used, it may be interconnected through leak-tight transfer arms and load locks which allow sample transfer without exposure to air.

There is no limit to the type of CVD which may be used in forming tungsten nitride films according to the invention, such that thermal CVD, plasma-promoted CVD, plasma-assisted CVD as well as newly developed atomic layer deposition (ALD) or atomic layer CVD (ALCVD) may all be practiced using the MOCVD processes of the invention, including the novel ALCVD process of the invention described below for use in forming the tungsten nitride films of the invention as well as other thin films or films requiring a high level of uniformity, conformality and the like.

In the processes of the present invention, the reaction can occur in any suitable apparatus, however, it is preferred that the reaction occur using a CVD process in order to obtain high purity and conformality. In using various CVD processes, in order to deliver the tungsten nitride precursor to the reaction chamber, it is preferred but not required to use at least one transport gas. However, it will be understood, based on the disclosure that a transport gas is not necessary. The transport gas may include one or more reactant gases, such as nitrogen-containing reactant gas(es) and/or hydrogen. Hydrogen can act as a transport gas, and is kept from reacting in transport, for example, by using a delivery temperature in the delivery and transport lines which is not high enough to cause reaction of hydrogen and the tungsten carbonyl compound. However, once in the reaction area, and without wishing to be bound by theory, as noted above, the hydrogen assists in the decomposition process and also bonds with CO ligands resulting from the decomposition process assisting in removal of such ligands from the reaction zone and helping to prevent their incorporation into the tungsten nitride being formed.

In addition to hydrogen, the transport gas may include one or more inert gases which may function merely as a carrier to deliver the precursor to the reaction area. Preferred transport gases are hydrogen or inert gases, however, it is within the scope of the invention to use a gas which is reactive within the deposition chamber for forming more stable intermediates during deposition. Preferably, if a reactant gas is used in the transport gas, such as hydrogen, it is used in addition to a nitrogen-containing gas which will ultimately reacted with the tungsten nitride precursor used for forming the tungsten nitride film, and would carry out the roles of assisting in decomposition and removal of CO ligands and in preventing of contamination of the tungsten nitride in accordance with the reactions described above.

Other inert gases for use in the transport gas in order to help transport the precursor to the reaction area which may be used instead of or included with any reactive gas such as hydrogen and/or nitrogen-containing reactant gas(es) within the transport gas include helium, argon, xenon, neon, krypton, carbon monoxide and/or mixtures and other combinations thereof. While nitrogen-containing gases, such as nitrogen, ammonia, hydrazine and the like may also be pre-mixed in some cases before the reaction zone with the transport gas(es) for certain processes within the scope of the invention, caution must be taken to avoid premature reaction prior to reaching the reaction chamber.

The transport gas(es) may be varied depending on the particular process parameters used and the desired composition of the resulting tungsten nitride film desired. In addition, the gases may be added with the precursor and/or added separately into the deposition chamber.

It is also possible to add gases which can be used as ligands in the tungsten nitride precursor such as halogen, ammonia, amine, carbonyl compounds and similar electron donors or ligands. However, fluorine while it may be used, is not preferred due to its high reactivity. Such additional gases may be provided to the precursor and/or transport gas(es) entering the deposition chamber as well as, for example, other high electron density ligands, weak nucleophiles such as alkenes, alkynes, phosphines, diketones and mixtures thereof. Such compounds may also be introduced by dissolving them in the source precursor and vaporizing the mixture such that the compound is delivered along with the vapor state precursor as opposed to being provided as an additional gas(es) in the at least one transport gas.

Preferred chemical vapor deposition methods used in the processes of the present invention may be thermal CVD, plasma-promoted CVD and ALCVD as described below although any CVD process may be used in the processes of the invention. "Thermal" CVD as used herein is intended to describe a CVD process in which all components are introduced to the chamber in gaseous form and the energy needed for bond cleavage is supplied completely by thermal energy. "Plasma-promoted" CVD as used herein is intended to describe a CVD process in which all components are introduced into the reactor in gaseous form, and the energy needed for bond cleavage is supplied in part by high energy electrons formed in a glow discharge or plasma having a plasma power density of from about 0 to about 100 W/cm$^2$. Plasma-promoted CVD takes advantage of the high energy electrons present in glow discharge to assist in dissociation of gaseous molecules, as is the case of plasma-enhanced CVD, a known CVD technique. Also plasma-assisted CVD may be used, although it does not take advantage of the use of low power plasma densities as with plasma-promoted CVD. The use of low power plasma density can prevent electrical damage to the film and substrate. If plasma-promoted CVD is used in the processes of the present invention, it is preferred that the plasma power density be from about 0.01 W/cm$^2$ to about 10 W/cm$^2$, and more preferably the density should be less than 0.5 W/cm$^2$.

According to one preferred embodiment of the processes of the invention, a tungsten nitride film is deposited by thermal CVD on a substrate. The source precursor, the at least one transport gas, preferably hydrogen and the substrate are maintained in the reaction chamber at an interior reaction substrate temperature of up to about 600° C., preferably from about 200° C. to about 350° C. For formation of an amorphous tungsten nitride film, the preferred substrate temperature is from about 200° C. to about 275° C. Temperatures higher than about 275° C. tend to form polycrystalline phase tungsten nitride, In addition, a nitrogen-containing gas is introduced into the chamber, including gases such as nitrogen, ammonia, or hydrazine, most preferably ammonia. The components are maintained under these conditions for a period of time sufficient to deposit a tungsten nitride film on the substrate, preferably for about 10 seconds to about 30 minutes depending on the processing conditions used and the desired film thickness.

Preferably, if using thermal CVD, the tungsten nitride film is deposited by introducing the tungsten nitride precursors of the invention alone or with a transport gas as described above, preferably hydrogen; a mixture of hydrogen with argon and/or xenon; or either of hydrogen alone or with an inert gas further in combination with an additional nitrogen-containing gas such as ammonia. However, it is most preferred that nitrogen-containing gas be introduced as a reactant gas separately from the precursor.

In a further preferred embodiment of the method according to the invention, plasma-promoted CVD is used to deposit a tungsten nitride film on a substrate. The source precursor, alone or in combination with a transport gas as described above, preferably hydrogen and/or an inert gas is introduced together with, or preferably separately from a nitrogen-containing reactant gas as described above, and the substrate is maintained in the chamber at an interior reaction substrate temperature of less than about 600° C., and preferably from about 200° C. to about 350° C., and most preferably from about 200° C. to about 275° C. In using plasma-promoted CVD, it is preferred that the plasma provided to the chamber has a plasma power density of from about 0.01 to about 10 W/cm$^2$ and a frequency of preferably from about 0 Hz to about $10^8$ Hz and more preferably from about 100 Hz to about $10^8$ Hz. The conditions are maintained for a period of time sufficient to deposit a tungsten nitride film onto the substrate, preferably from about 10 seconds to about 30 minutes depending on the processing conditions and the desired film thickness. In addition to the use of a transport gas, a nitrogen-containing gas such as ammonia is introduced into the chamber.

While the tungsten nitride of the invention may be made in any suitable apparatus capable of accommodating the reaction and reaction conditions, it is preferred that a CVD reactor be used. Such a reactor may be any CVD reactor which preferably has the following basic components: a precursor delivery system for storing and controlling the delivery of the tungsten nitride source precursor, i.e., the tungsten carbonyl compound, a vacuum chamber, a pumping system for maintaining an appropriately reduced pressure, a power supply for creating plasma discharge (when using plasma-promoted CVD), a temperature control system, and gas or vapor handling capability for metering and controlling the flow of reactants and products resulting from the process. The precursor delivery system may be a pressure-based bubbler or sublimator, a hot-source mass flow controller, a liquid delivery system, a direct liquid injection system, or other similar apparatus.

When depositing tungsten nitride films according to the method, the source precursor mixture is preferably placed in a reservoir which may be heated, to a temperature sufficient to ensure sublimation or vaporization but not so high as to cause premature decomposition of the tungsten carbonyl compound, and preferably from about 85° C. to about 115° C. The reservoir may be heated by a combination of resistance heating tape and associated power supply. The heating temperature will vary depending upon the physical properties of the precursor used and the presence of any mixed gases as transport gases and/or reactant gases. A mass flow controller, which may be isolated from the reservoir by a high vacuum valve, is preferably provided to control gas flow into the reservoir.

Various transport gases may be used as noted above, such as hydrogen, helium, argon, or xenon as inert transport gases and/or nitrogen-containing gases as reactant gases, when a conventional pressure- and/or temperature-based mass flow control delivery system is used as the delivery system for the source precursor into the deposition chamber. Such gases may also function as pressurizing agents when using a liquid delivery system. Most preferably, such gases are introduced into the tungsten nitride precursor in a mixing zone prior to entering the reaction area. Liquid delivery systems may include a combination micropump and vaporizer head. A preferred example of a delivery system for the tungsten nitride source precursor is a hot source mass flow controller, for example, an MKS Model 1150 MFC which does not require the use of a carrier or pressurizing gas. Another example includes a solid source delivery system such as the MKS 1153 system which also does not require use of a carrier gas or pressurizing gas for delivery.

In one preferred embodiment of the method of the present invention, the tungsten nitride precursor, in vapor form, or a mixture of the tungsten nitride precursor and any transport gas combined with the precursor, are transported into the CVD reactor through delivery lines which are preferably maintained at the same temperature as the reservoir, using a combination of resistance heating tape and an associated power supply to prevent precursor recondensation. The CVD reactor may be an cold-wall stainless steel reactor which can accommodate eight-inch wafer or 200 mm preferably equipped with plasma generation capability. The plasma may be generated by various sources, such as direct current plasma, radio frequency plasma, low frequency plasma, high density plasma, electron cyclotron plasma, inductively coupled plasma, microwave plasma or other similar sources. The plasma may be used for dual purposes such as for in situ pre-deposition substrate cleaning and/or for actual deposition if using plasma-promoted CVD.

The reactor is preferably also equipped with an electrical bias on the substrate. The bias can be derived from direct current, a low radio frequency of from less than about 500 kHz to about $10^6$ kHz, or a microwave frequency of from about $10^6$ to about $10^8$ kHz or from other suitable sources.

Evacuation of the CVD deposition reactor may be accomplished by various pumping systems. Suitable pumping systems include a high vacuum ($10^{-6}$ torr or less) pumping system, which may use either a cryogenic-type or a turbomolecular-type pump, preferably a cryogenic-type pump. Such a system ensures a high vacuum base pressure in the reactor. A vacuum system having a roots blower or dry pump may also be used for handling the high gas throughput during CVD runs. The high vacuum system and the roots blower or dry pump system are both preferably isolated from the CVD reactor by high vacuum gate valves.

The CVD reactor is preferably equipped with a high vacuum load-lock system for transporting and loading substrates as large as about 300 mm wafers into the reactor in order to provide tight control over the cleanliness of the CVD chamber and to prevent undesirable contamination from exposure to ambient conditions during sample loading and unloading. The reactor may also interface with a vacuum central handling unit which may be used to transfer the substrate between multiple CVD reactors to deposit sequential or alternating layers of tungsten nitride and other types of films for single or multilayered coatings or metallization schemes such as those described above.

As noted above, after being charged to the reservoir, the tungsten nitride source precursor is heated to a temperature high enough to ensure the precursor's sublimation or vaporization, but not so high that the precursor would be prematurely decomposed. When conventional pressure-based and/or temperature-based, mass flow control-type delivery systems or solid-source-type delivery systems are used to control the flow of precursor into the CVD reactor, the liquid in the reservoir is generally at room temperature. In a liquid delivery system, the vaporizer head, not the liquid in the reservoir, is heated to a temperature high enough to ensure sublimation or vaporization without causing decomposition.

When a gas delivery system is used, any gaseous substance may be used which is substantially inert to the source precursor mixture or which reacts with the source precursor to form one or more intermediates which are more easily transported to the reaction zone and/or which could more readily decompose to yield the desired tungsten nitride film. Exemplary gases for use in gas delivery systems include those listed above as transport gases. Hydrogen is particularly preferred as a carrier gas in a gaseous delivery system for both thermal CVD and plasma-promoted CVD. The flow rate of the gas in the gaseous delivery system for either plasma-promoted or thermal CVD preferably varies from about 10 standard $cm^3$/min to about 25 standard 1/min, and preferably from about 10 to about 5000 $cm^3$/min.

For all delivery modes, the flow rate of the vapor of the tungsten nitride source precursor could range from about 0.01 to about 500 standard $cm^3$/min, and more preferably from about 1 to about 100 standard $cm^3$/min. The transport gas for forming films according to the method of the invention may be any of those described above, and is preferably hydrogen for both thermal CVD and plasma-promoted CVD. The flow rate of the at least one transport gas which may be or may include hydrogen is preferably from about 10 standard $cm^3$/min to about 10 standard 1/min, and more preferably, from about 100 standard $cm^3$/min to about 5 1/min. The corresponding reactor pressure is preferably from about 0.1 torr to about 1000 torr, and more preferably from about 0.2 to 10 torr.

While the transport gas(es) may include one or more carrier or reactant gases, it should be understood that the function of the gases is determined by the type of gases being used, the nature of the precursor, the type of CVD and the associated process parameters. Transport gases while performing the function of transporting the tungsten nitride source precursor vapor to the substrate may also undergo reaction in the chamber during deposition. Further, reactive gases such as nitrogen-containing reactant gases may include inert components and may be introduced together with the precursor or, more preferably, independently thereof. All gases, regardless of their inert or reactive nature which are used in the transport gas(es) assist the tungsten nitride source precursor in reaching the substrate.

Tungsten nitride and tungsten nitride films according to the invention may also be prepared using thermal CVD based on the method of the present invention. To prepare a tungsten nitride film, it is preferred that hydrogen, argon, helium and/or xenon, preferably hydrogen, are introduced as the transport gas(es) and that there also be a nitrogen-containing reactant gas introduced together with the transport gas or independently thereof as discussed above. The preferred conditions and apparatus are as described above.

Tungsten nitride films may also be formed using ALD or ALCVD techniques. Preferably, however, the tungsten nitride films are formed using the ALCVD process of the invention which was developed by applicants and found to be useful to form atomic level thin films of tungsten nitride in accordance with the invention. However, the ALCVD process of the invention may also be used to form other thin films, including but not limited to tantalum, tantalum nitride, tungsten, copper, silicon nitride, tantalum-nitride-silicide and any other thin films useful in various microelectronic devices, similar small microstructures or as protective or other hard coatings for objects. This ALCVD process of the invention is particularly useful in the processes of the present invention for forming the tungsten nitrides of the invention having the preferred stoichiometry as noted above.

The ALCVD process of the invention, involves atomic layer CVD (ALCVD) or atomic layer deposition (ALD)

(hereinafter referred to collectively for purpose of convenience as ALCVD) in which very thin liners of atomic level controllability can be formed and the resulting liners and films can be used for incorporating in semiconductor structures for filling in fabrication flaws. Such techniques are based on the principle of self-limiting adsorption of individual monolayers of the source precursor on the substrate surface, followed by reaction with an appropriately selected reactant to grow a single molecular layer of the desired material. Thicker films are produced through repeating the procedure through repeated growth cycles until the desired target thickness is met.

The applicants have developed a modified ALCVD in which a substrate with at least one surface to be coated, a source precursor, preferably a single source precursor, and any reactant(s), preferably in gaseous or vapor form, for a necessary for forming a desired reactant product and which is capable of reacting with the precursor to form a desired reactant product on the substrate surface such as a film, liner, layer or other similar material are introduced into a deposition chamber. The reactant(s) and precursor, preferably in vapor or gaseous form, are pulsed sequentially into the deposition chamber, with inert gas pulses in between the reactant and precursor pulses, for a specified, preferably predetermined short period of time, and allowed to react on a substrate surface to form an atomic layer of desired thickness, preferably on the scale of an atomic monolayer.

The pulsing of the precursor is carried out using conventional pressure-based and/or temperature-based mass flow control-type delivery systems, solid-source-type delivery systems, which could be coupled to the deposition chamber, if needed, through pneumatically or electronically controlled valves that allow introduction of the source precursor in short pulses into the deposition chamber.

The pulsing of the reactant gas is carried-out using electronic mass flow controllers which can also be coupled to the deposition chamber, if needed, through a pneumatically or electronically controlled valves that allow introduction of the source precursor in short pulses into the deposition chamber.

The time period of the precursor and reactant gas pulse varies in accordance with the reaction rate, reactivity of the components used, the reactor pressure, substrate temperature, and desired thickness. For example, the faster the reaction and/or higher the component reactivities with respect to each other, the shorter the time period. The pulse time period for the precursor and reactant gas ranges from about 0.5 seconds to about 10 minutes, and more preferably, from 1 second to five minutes. The pulse times for the precursor and reactant gas are varied to achieve layers of preferred thickness from about 0.25 nm to about 10 nm and, more preferably, from about 0.5 nm to about 2.5 nm. It will be understood, based on this disclosure, that the time and thickness may be varied for different applications and optimized within the parameters of a given reaction and deposition, provided the thin layers benefits of the invention are not significantly diminished.

A basic overview of the process, in one preferred embodiment includes introducing into a deposition chamber a substrate having a surface, and heating the substrate to a temperature that allows adsorption of the tungsten source precursor or an appropriate intermediate of the source precursor. The heated substrate surface is then exposed to a tungsten source precursor for a period of time sufficient to form a self-limiting monolayer of the source precursor or appropriate source precursor intermediate on the substrate surface. The precursor is introduced into the deposition chamber by pulsing it using an appropriate precursor delivery method with or without the use of a transport gas, which may be any of the transport gases described above. The deposition chamber is then purged with an inert gas for a period long enough to ensure removal of all gas phase precursor species, without removing the adsorbed precursor layer. The inert gas is introduced by pulsing using an appropriate mass flow controller or valving system. Any such system, including those mentioned above and known to those skilled in the art or to be developed may be used for such purpose. A nitrogen-bearing gas such as the nitrogen-containing reactant gases described above is then introduced into the deposition chamber for a period long enough to ensure reaction with the adsorbed precursor layer, leading to the formation of a first $WN_x$ atomic layer on the substrate surface. The nitrogen bearing gas is also introduced by pulsing using an appropriate mass flow controller or valving system. The deposition chamber is preferably again purged with an inert gas for a period long enough to ensure removal of all remaining nitrogen-bearing gas from the deposition chamber. In the preferred embodiment, the inert gas is introduced by pulsing using an appropriate mass flow controller or valving system and the gas introducing and purging steps described above are repeated in a sequential and alternating manner until the desired tungsten nitride film thickness is achieved through atomic layer by atomic layer growth.

After every precursor or reactant(s) pulse is introduced into the deposition chamber, and after each atomic layer is formed by reacting the precursor and reactant(s) on the substrate surface, an inert, cleaning or purge gas, such as argon, xenon, nitrogen, krypton, or the like, preferably argon or nitrogen, is pulsed into the deposition chamber preferably in the same manner and using similar apparatus as was used with respect to pulsing the reactant gas into the reactor in order to remove any remaining precursor, reactant or reaction byproducts from the deposition chamber. The purging should continue for a sufficient period of time to terminate the reaction, which time will vary for different reactions. However, preferably purging occurs from about 0.5 seconds to about 10 minutes, and more preferably, from 1 second to five minutes. At this point, the process may be stopped with the formation of only a thin monolayer of the preferred thicknesses as noted above, or alternatively, the process may be repeated by pulsing the precursor and any necessary reactant(s) again into the chamber to form another atomic film of desired thickness on the prior film and further purging as described above. This process of intermittent pulsing of reactant(s) and precursor followed by purging with inert gas continues until a film is formed of desired thickness, preferably a total film thickness of from about 2.5 nm to about 1 $\mu$m, although the total thickness would be determined by the ultimate application of the film.

It is further within the scope of the invention to vary the reactants or precursors in different intermittent steps in order to form pulsed multilayer films having very small dimensions on the order of monolayers. Further, alloy layers may also be formed by mixing more than one precursor and/or more than one reactant or by varying the layers to include different species.

When using atomic layer CVD, the substrate temperature is maintained at a temperature high enough to allow precursor species adsorption, but not so high as to cause premature precursor decomposition. Preferably, the substrate is maintained in the chamber at an interior reaction substrate temperature of less than about 450° C., more preferably from about 50° C. to about 350° C., and most preferably from about 100° C. to about 275° C. When using atomic layer CVD, all other processing conditions, including flow rates and pressure ranges, are similar to those noted above for thermal CVD.

A critical pathway in the successful achievement of ALCVD growth is the adsorption on the substrate surface of precursor intermediate species that are conducive to the monolayer-by-monolayer reaction with reactant gases. Without wishing to be bound by theory, in one preferred embodiment, the ALCVD reaction of W(CO)$_6$ and ammonia is believed to proceed according to the following pathways:

$$W(CO)_6(gas) \rightarrow W(CO)n(adsorbed, 1<n, 5) \quad (IV)$$

$$W(CO)_n + NH_3 \rightarrow WN_x + \text{carbon monoxide+organic compounds+ nitrogen compounds} \quad (V)$$

In the example in which W(CO)$_6$ and ammonia are used in the presence of hydrogen, the pathways are believed to be as follows:

$$W(CO)_6(gas) \rightarrow W(CO)_n(adsorbed, 1<5, n) \quad (VI)$$

$$W(CO)_n + H_2 + NH_3 \rightarrow WNx + \text{carbon monoxide+organic compounds+ nitrogen compounds} \quad (VII)$$

The advantages of the process are immediately apparent in that the growth of the film can be highly regulated and the conformality achieved is high with good step coverage while maintaining a very small thicknesses if desired. Further, such thin films have numerous applications in the ULSI and small scale electronic devices of the future and in a wide variety of applications, including sub-100 nm interconnect architectures, and giga-scale and tera-scale computer device schemes.

This ALD or ALCVD process can be adapted for use in forming tungsten nitride and tungsten nitride films according to the present invention, although it will be understood, based on this disclosure that the process is such that any suitable reaction process, particularly any suitable CVD reaction process, may be used to form tungsten nitride and tungsten nitride films according to the present invention provided the temperature is kept at the desired levels, and preferably below about 600° C.

The invention, as well as the appearance and composition of the pure tungsten nitride and other tungsten-based films deposited according to the method of the invention, and their structural, compositional, and electrical properties, will now be described in accordance with the following, non-limiting examples:

EXAMPLE 1

An alpha-type, 200 mm-wafer, cold-wall, plasma-capable CVD reactor, equipped with a high vacuum loadlock for wafer transport and handling was used in this Example. The use of the loadlock system allowed for tight control over the cleanliness of the CVD chamber, and prevented undesirable contamination from exposure to ambient conditions during sample loading and unloading. In addition, a cryogenic pump was used to routinely achieve a chamber base pressure at about $10^{-6}$ torr, while a roots blower pumping stack was used during actual growth runs. The precursor was placed in a reservoir heated to temperatures ranging from 85 to 100° C., depending on the processing conditions, and the precursor flow rate into the reactor was regulated by an MKS 1153 solid source delivery system (SSDS). The SSDS and all delivery lines were heated to 120° C. to prevent precursor recondensation.

Parallel plate, radio-frequency plasma (13.56 MHz) capability was used for in situ, pre-deposition, wafer cleaning in a hydrogen-argon mixture plasma prior to the actual deposition step. In this parallel plate configuration, the wafer was loaded onto the lower, heated, electrode. Once the pre-deposition cleaning step was completed, precursor vapor of tungsten hexacarbonyl was pre-mixed with hydrogen (H$_2$) at the reactor inlet, then introduced into the reactor chamber through a cone-shaped showerhead. The cone was designed for uniform distribution of reactant vapor across the entire surface area of the 200 mm wafer. Conversely, NH$_3$ was introduced directly into the chamber through a separate feedthrough. The use of a separate inlet for NH$_3$ was designed to eliminate any early contact with the precursor vapor, which could lead to premature reaction and precursor decomposition. The deposition of tungsten nitride was investigated by performing a large number of tungsten nitride films within the process window presented in Table 1.

TABLE 1

| Parameter | Values Of Parameters During Formation of Tungsten Nitride Films |
|---|---|
| W(CO)$_6$ Source Temperature | 85–100° C. |
| Wafer Temperature | 200–350° C. |
| Reactor Base Pressure | ~$10^{-6}$ torr |
| Reactor Process Pressure | 0.2–0.5 torr |
| Precursor Flow Rate | 1–20 standard cm$^3$/min |
| Hydrogen Flow Rate | 50–200 standard cm$^3$/min |
| Ammonia Flow Rate | 100–500 standard cm$^3$/min |
| Growth Rate | 4–10 nm/min |

The structural, compositional, and electrical properties of the various tungsten nitride films thus produced were analyzed by x-ray photoelectron spectroscopy (XPS), cross-section scanning electron microscopy (CS-SEM), x-ray diffraction (XRD), transmission electron microscopy (TEM), four-point resistivity probe, and Rutherford backscattering spectrometry (RBS).

XPS studies were performed using a Perkin-Elmer Physical Electronics Model 5600 multi-technique system with a spherical capacitor analyzer. The analyzer was calibrated using the gold $f_{7/2}$ line at 83.8 eV as a reference line. All spectra were acquired using a pass energy of 58.7 eV at a resolution of 0.25 eV. The primary x-ray beam employed was Mg Kα at 1274 eV, with primary beam energy and power of, respectively, 15 keV and 300 W the results were standardized with a pure tungsten film sputtered on a silicon substrate since a W$_2$N standard was not available.

XPS results indicated that at the lowest processing temperature investigated, where precursor dissocation would be expected to be the least efficient given the reduced thermal budget available to the decomposition reaction, the films grown had carbon and oxygen concentrations of $\leq 5$ at %. In addition, XPS indicated a constant N:W ratio throughout the bulk of the tungsten nitride films. Additionally, high resolution XPS elemental core peak analysis was performed to determine the exact nature of the tungsten nitride phase produced. In this respect, FIG. 1 in spectra (a) and (b) compare peak profile and associated binding energy location for the XPS W4f$_{7/2}$ core peaks from, respectively, a sputter-deposited W standard and a representative MOCVD WN$_x$ sample. For both samples, binding energy locations were calibrated using the energy location of the corresponding surface hydrocarbon peak as a reference. A shift of ~1 eV towards higher binding energy was observed for the W4f$_{7/2}$ peak in the MOCVD WN$_x$ sample in comparison with its counterpart in pure W. This shift is in agreement with the findings of Takeyama and Noya, and indicates the formation of a W$_2$N phase. M. Takeyama et al., *Japan J. Appl. Phys.*, 36, pp. 2261 (1997).

Figure 2:
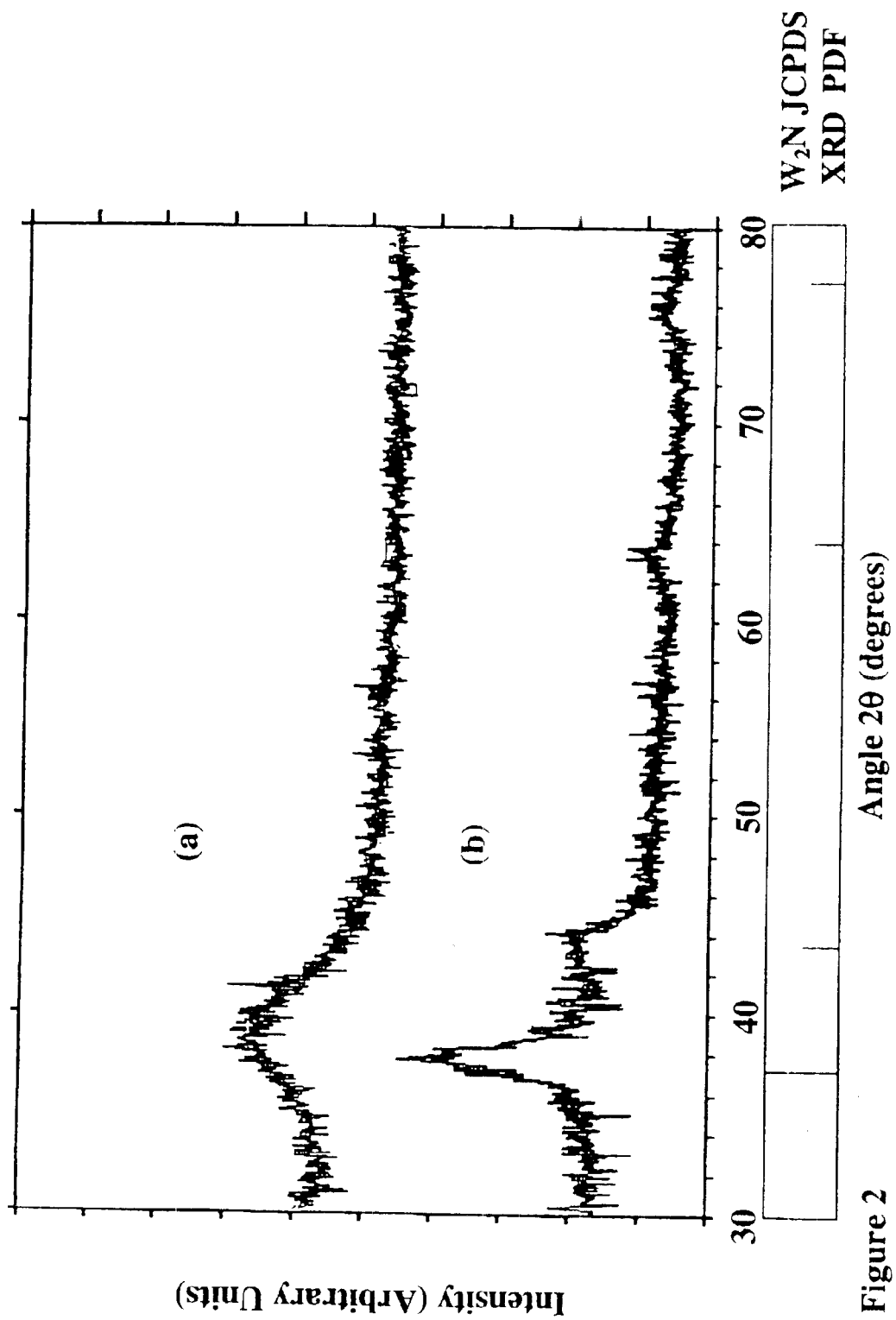
FIG. 2 is a representation of the x-ray diffraction (XRD) pattern of MOCVD-grown W$_2$N films grown in Example 1 at substrate temperatures of: (a) 200° C. (film thickness of about 52 nm) and (b) 275° C. (film thickness of about 63 nm)

XRD analyses were carried out on a Scintag XDS 2000 x-ray diffractometer equipped with a Cu Kα x-ray source and a horizontal wide angle four axis goniometer with stepping motors which allowed independent or coupled θ/2θ axes motion. XRD spectra were collected in the low angle incidence geometry, with an angle of incidence of 5° being used (angle as measured between the incident beam and the sample surface). In this mode, data collection is performed by fixing the incidence angle at 5°, and the XRD pattern is collected for 2θ ranging from 30° to 80°. The collected XRD patterns were compared to tungsten nitride reference patterns from the standard Joint Committee for Powder Diffraction Standards (JCPDS) powder diffraction file (PDF). In this respect, XRD indicated a completely amorphous phase for films grown at substrate temperatures below 275° C., as shown in FIG. 2 in spectra (a). Alternatively, films grown at substrate temperatures above 275° C. exhibited XRD reflections that are consistent with JCPDS PDF for a W$_2$N reference pattern, as shown in spectra (b) of FIG. 2. The XRD findings are thus in agreement with the XPS data in terms of the formation of W$_2$N phase.

Figure 3:
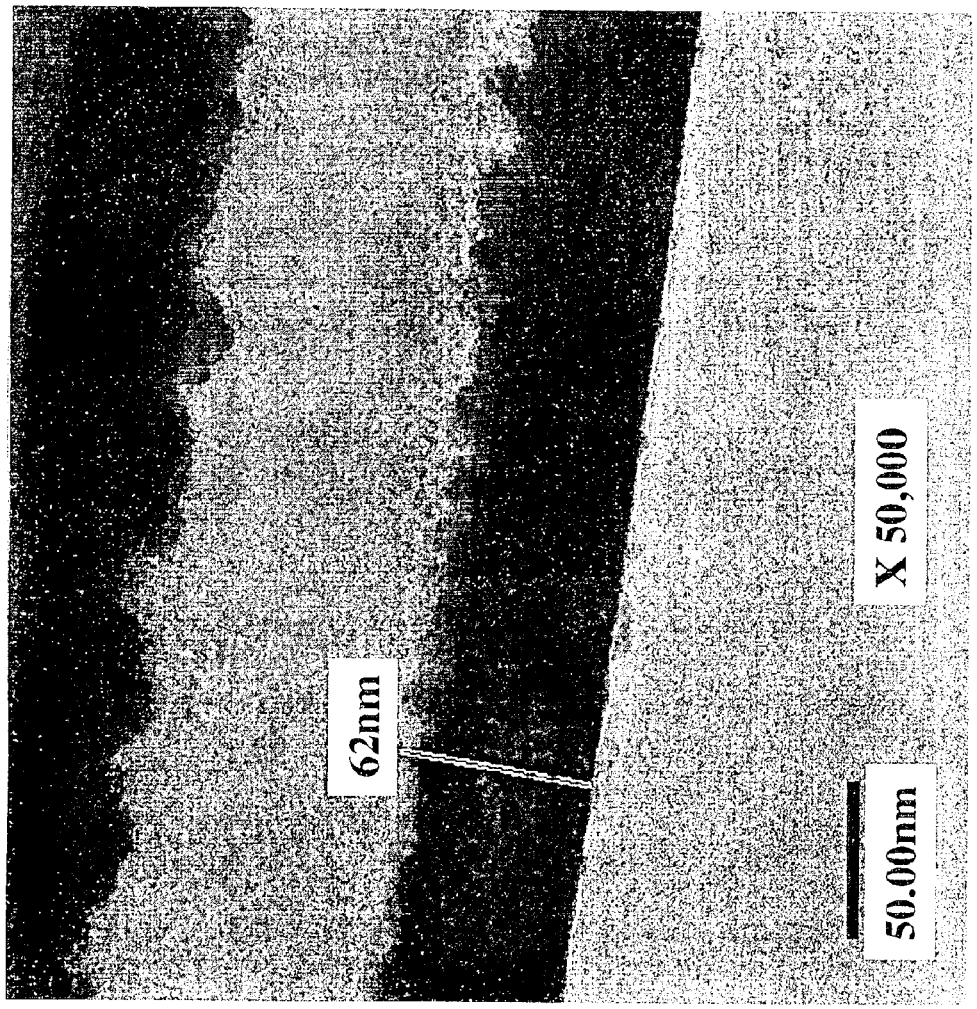
FIG. 3 is a representation of a bright field cross-section transmission electron microscopy (TEM) image of a representative 62 nm-thick MOCVD-grown W$_2$N film formed in Example 1.
Figure 4:
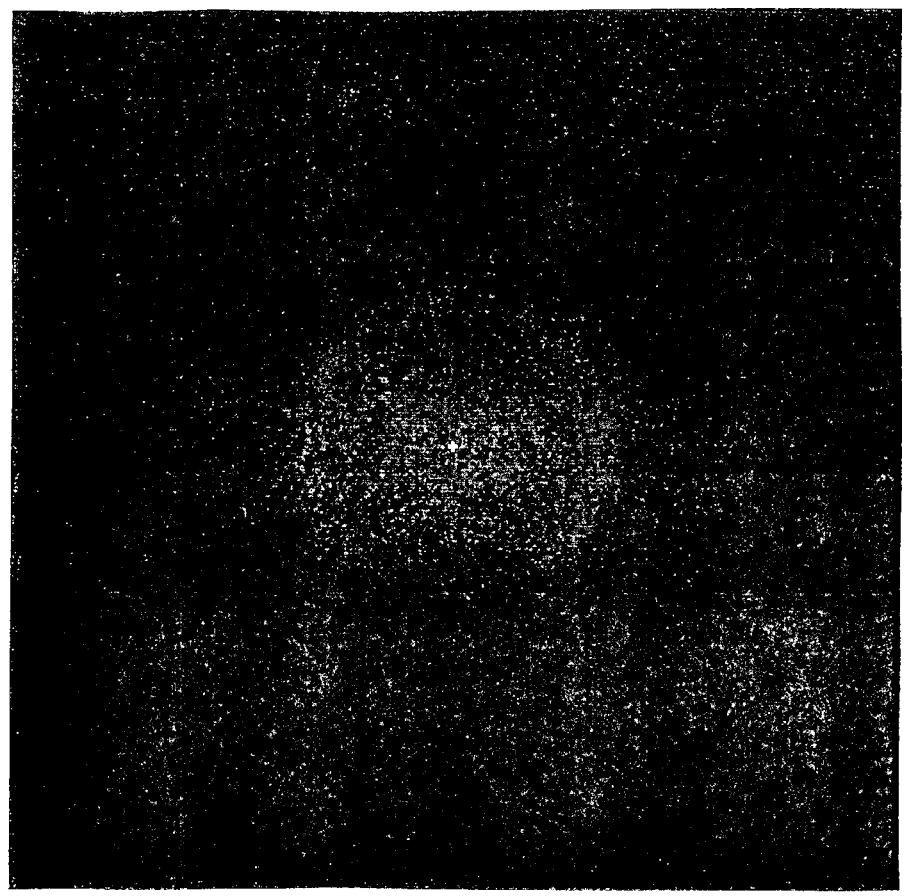
FIG. 4 is a representation of Fast Fourier Transform (FFT) TEM images of the W$_2$N samples of FIG. 3 from Example 1 showing an amorphous W$_2$N phase.

Further microstructural investigations of the MOCVD-grown W$_2$N films were performed by TEM using a JEOL 2010F field emission electron microscope operating at 200 keV primary energy beam. TEM was performed on a JEOL 2010F system operating at 200 keV. Samples were tilted during TEM imaging so that the <110> zone axis of the silicon substrate was normal to the incident electron beam. The Fast Fourier Transform (FFT) method was applied to obtain diffraction patterns from high-resolution bright field images when the selected area electron diffraction (SAED) spot size exceeded the size of the area of interest. In this respect, FIG. 3 displays a representative cross-section TEM bright field image of a W$_2$N film deposited at 200° C. As can be seen, TEM confirmed the XRD data in terms of the amorphousness of 30 nm-thick W$_2$N films. This result is also supported by FFT analyses, as exhibited in FIG. 4, which yielded a pattern that is characteristic of amorphous structures, namely a continuous diffuse ring with no diffraction spots.

Figure 5:
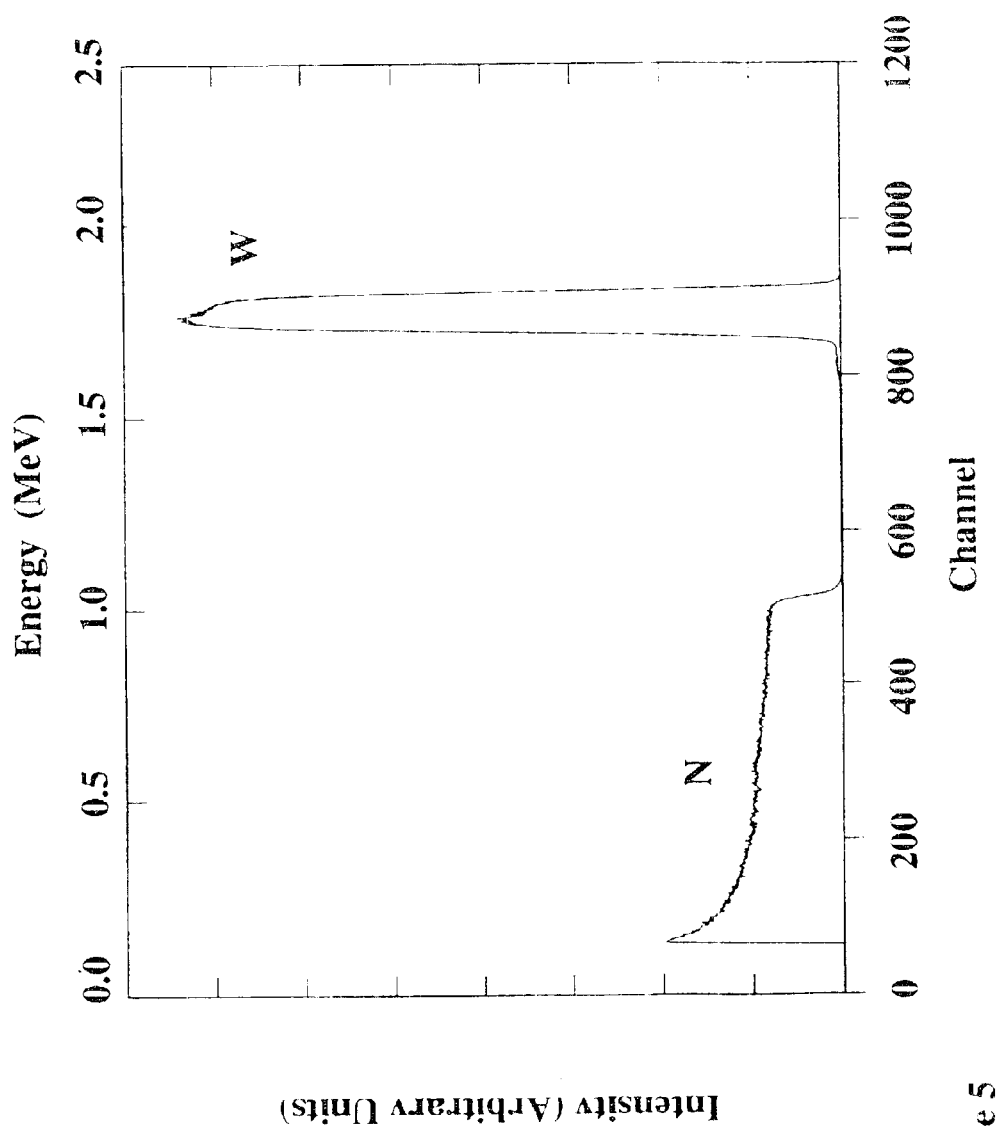
FIG. 5 is a representation of Rutherford backscattering spectroscopy (RBS) spectra of MOCVD-grown W$_2$N films formed in accordance with Example 1.

Rutherford backscattering spectroscopy (RBS) was also performed to investigate the presence of any heavy element contaminants. A 2 MeV He$^{2+}$ beam was used for the RBS measurements, and the resulting data was calibrated using bulk gold and carbon samples. No heavy element contaminants were detected by RBS, as shown in FIG. 5 for a representative RBS spectrum of an MOCVD W$_2$N sample.

Figure 6:
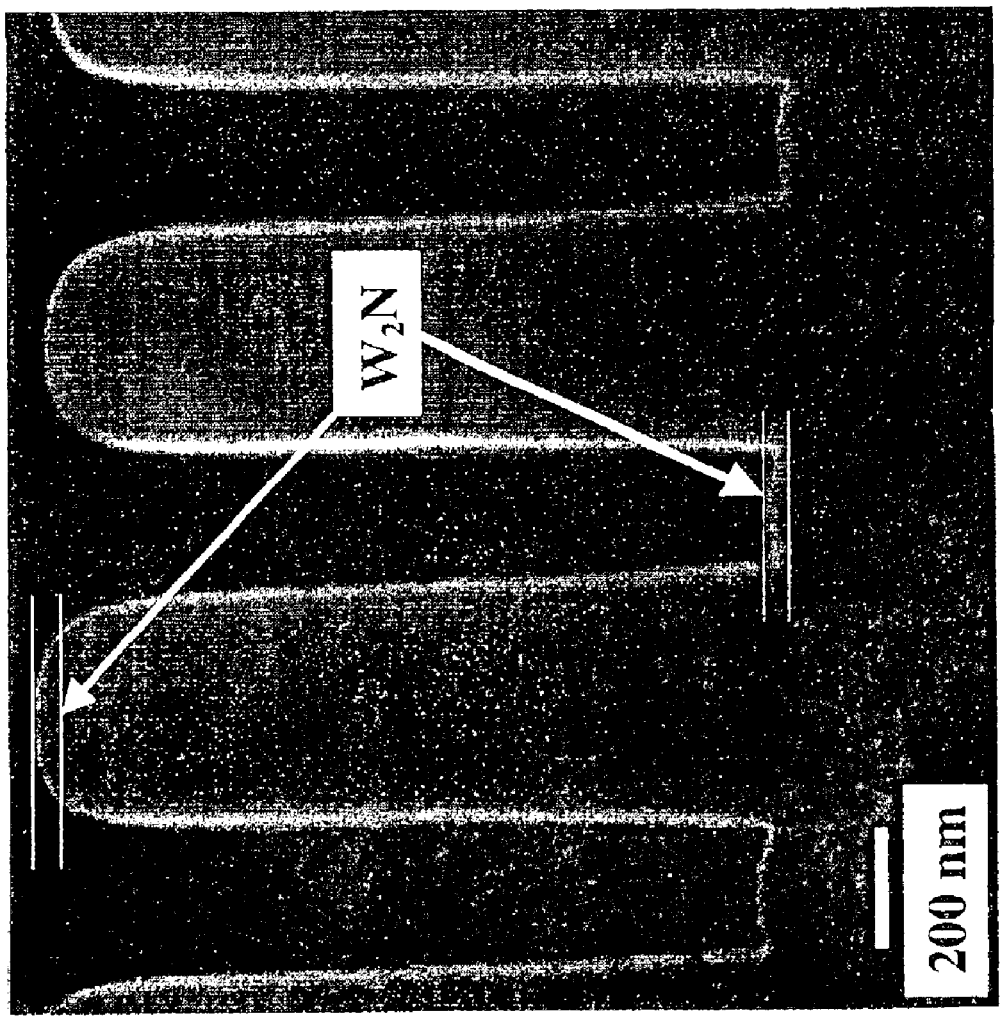
FIG. 6 is a representation of a cross-section scanning electron microscopy (CS-SEM) image of MOCVD-grown W$_2$N films in nominal 0.25 μm trench structures.
Figure 7:
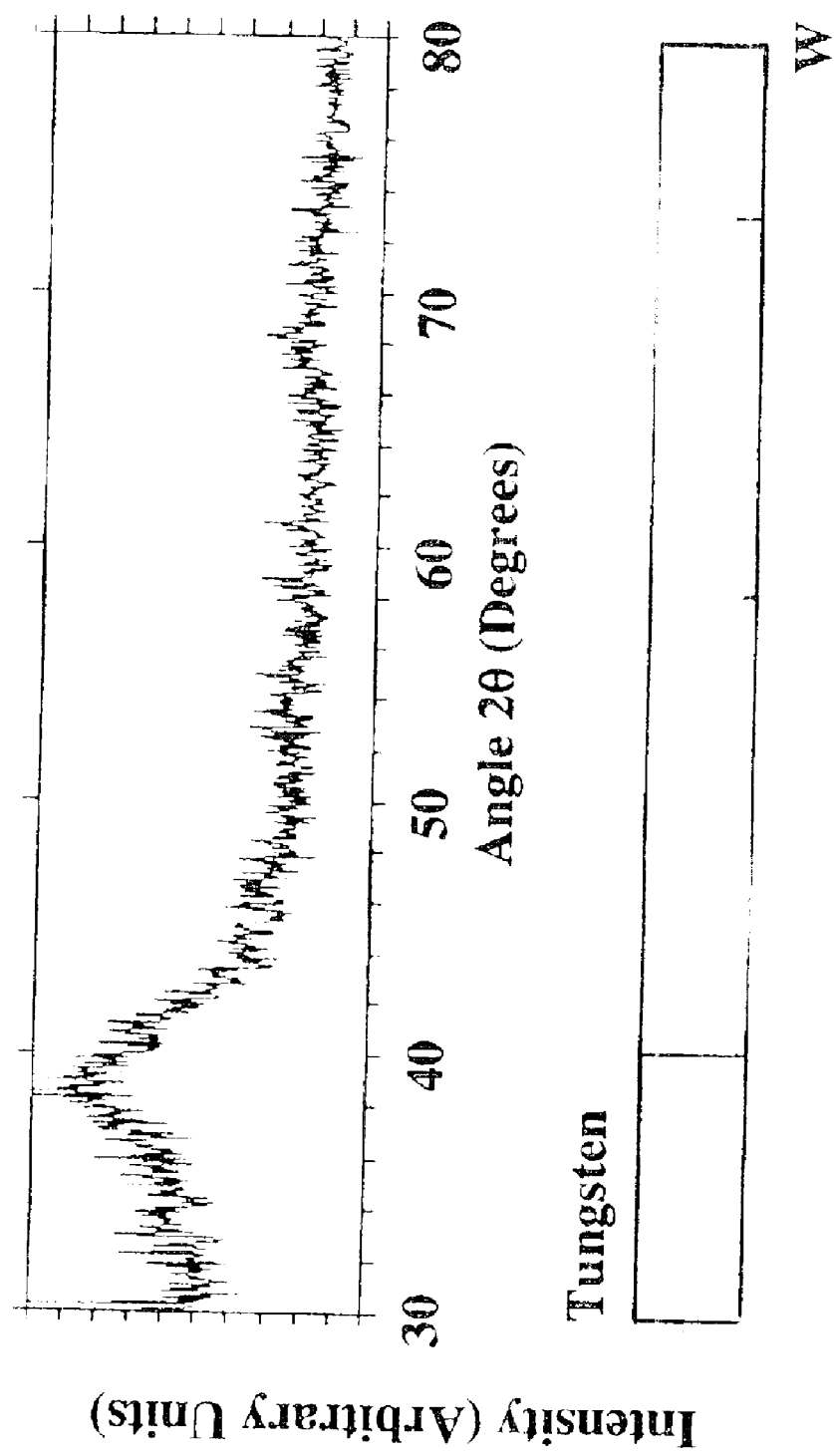
FIG. 7 is a representation of XRD patterns of a W$_2$N films produced using thermal CVD in accordance with an embodiment of the invention as set forth in Example 2.
Figure 8:
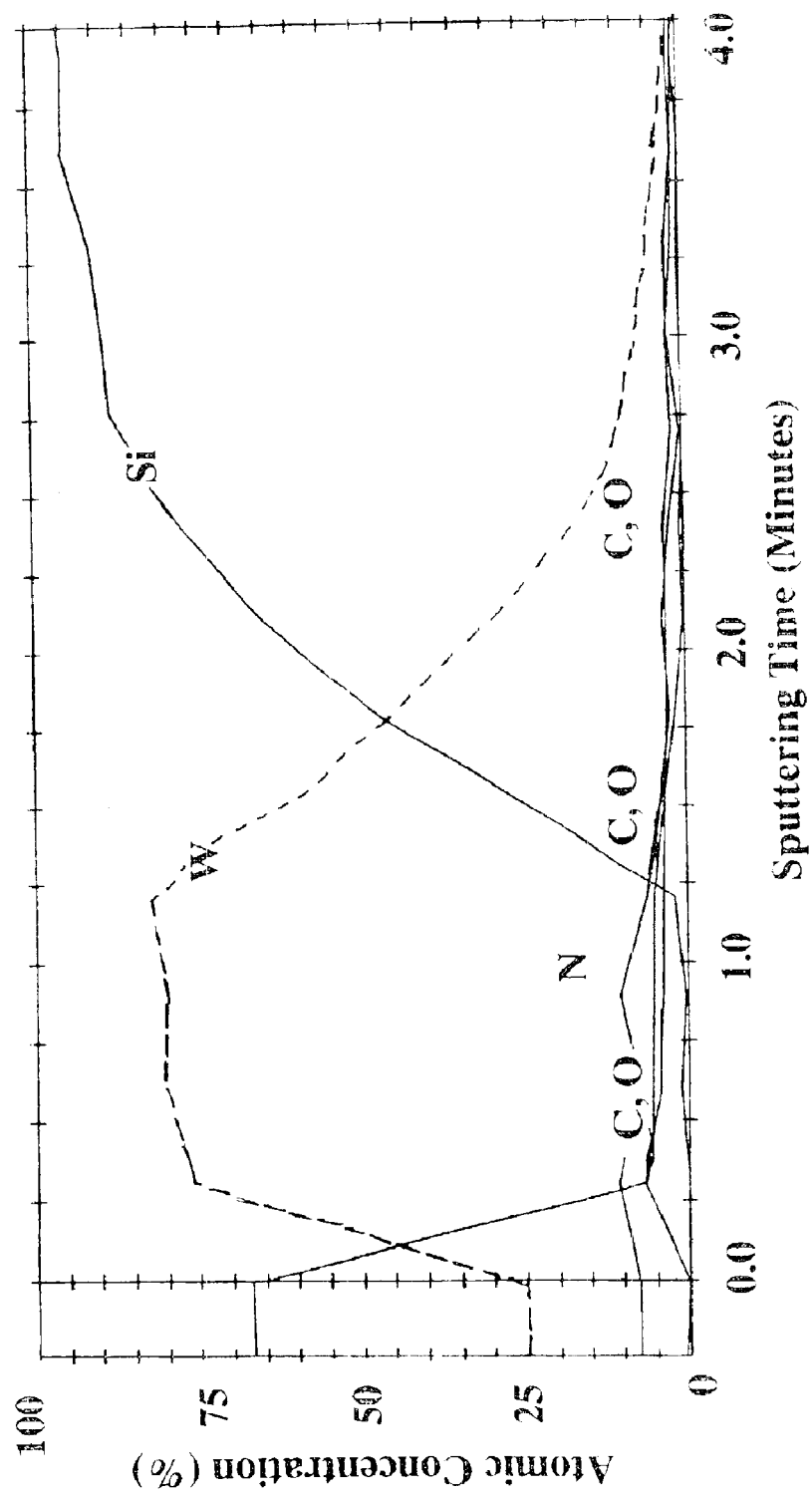
FIG. 8 is a representation of XPS spectra of the tungsten nitride films of Example 2.
Figure 9:
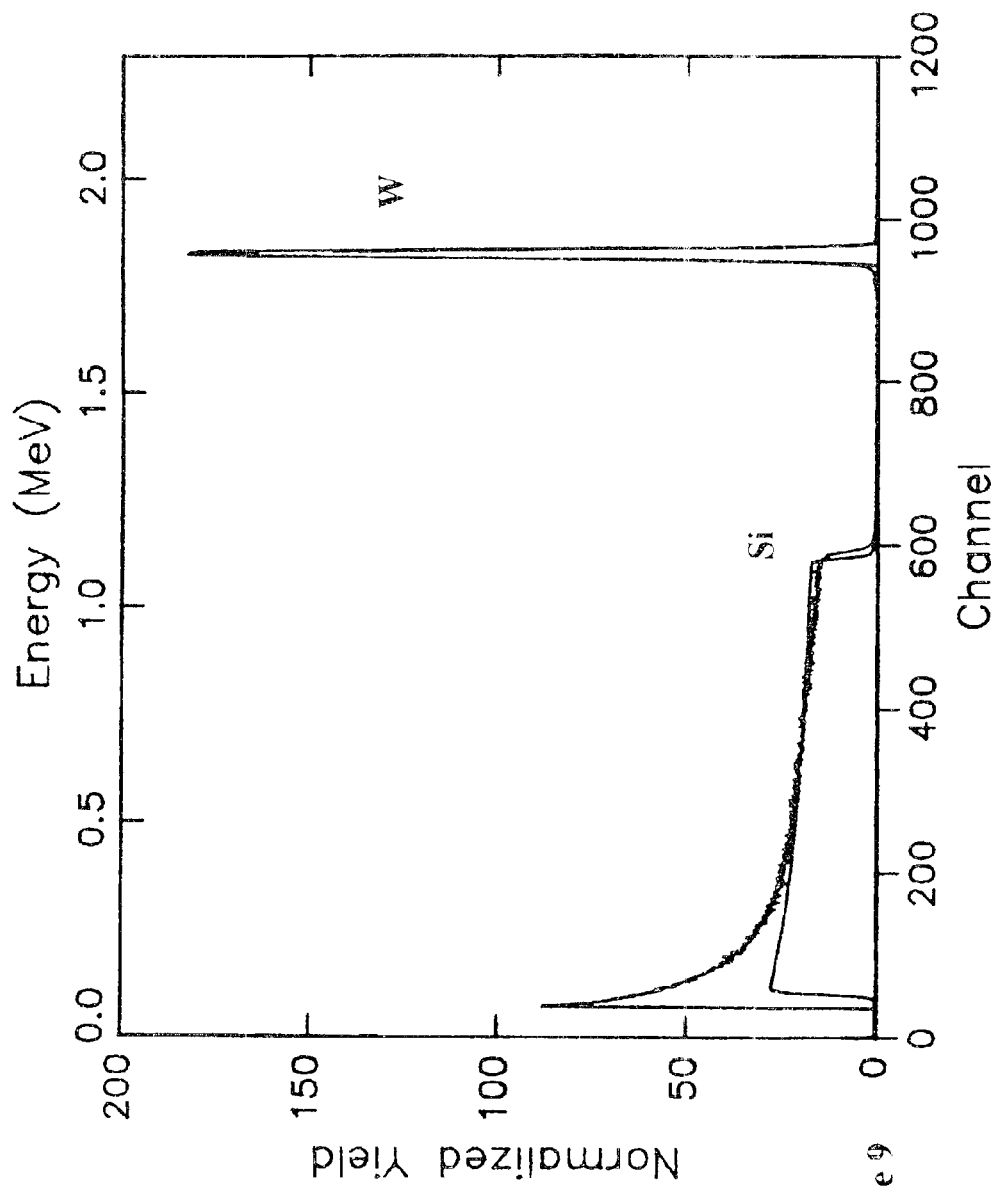
FIG. 9 is a representation of RBS spectra of the tungsten nitride films of Example 2.
Figure 10:
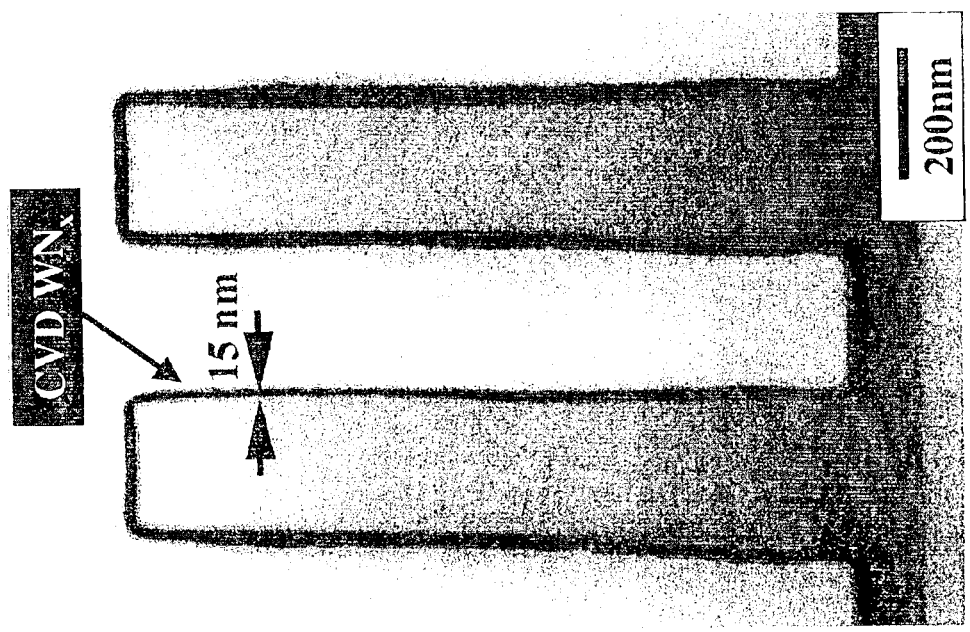
FIG. 10 is a representation of a typical cross-section TEM-magnified view of a representative silicon substrate upon which oxide trench patterns, of nominal diameter 200 nm and 6:1 aspect ratio, are formed and upon which a conformal tungsten nitride coating of Example 3 has been deposited.
Figure 11:
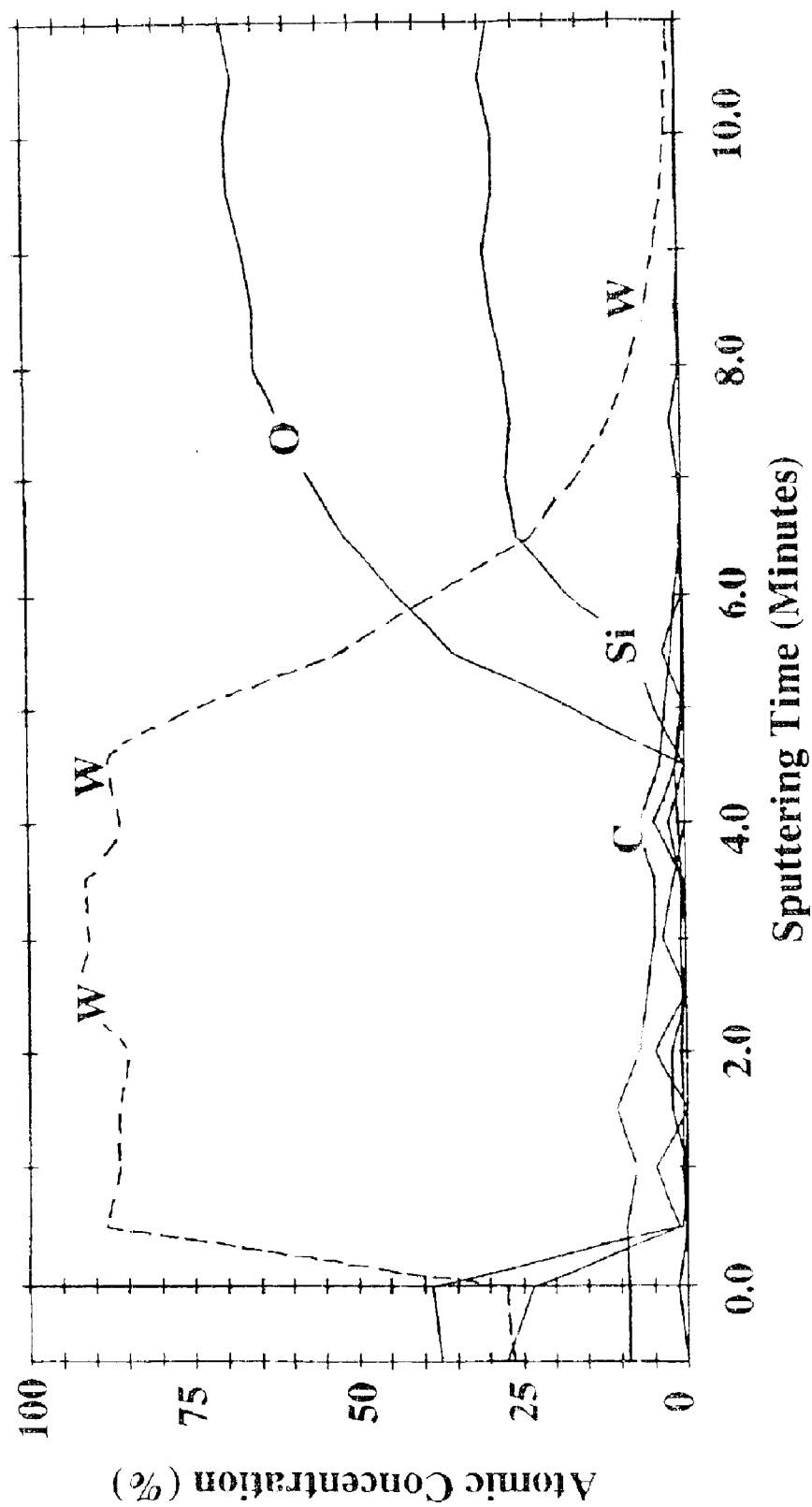
FIG. 11 is a representation of XPS spectra of the tungsten nitride films formed by the thermal CVD reaction in Example 3 according to an embodiment of the method.
Figure 12:
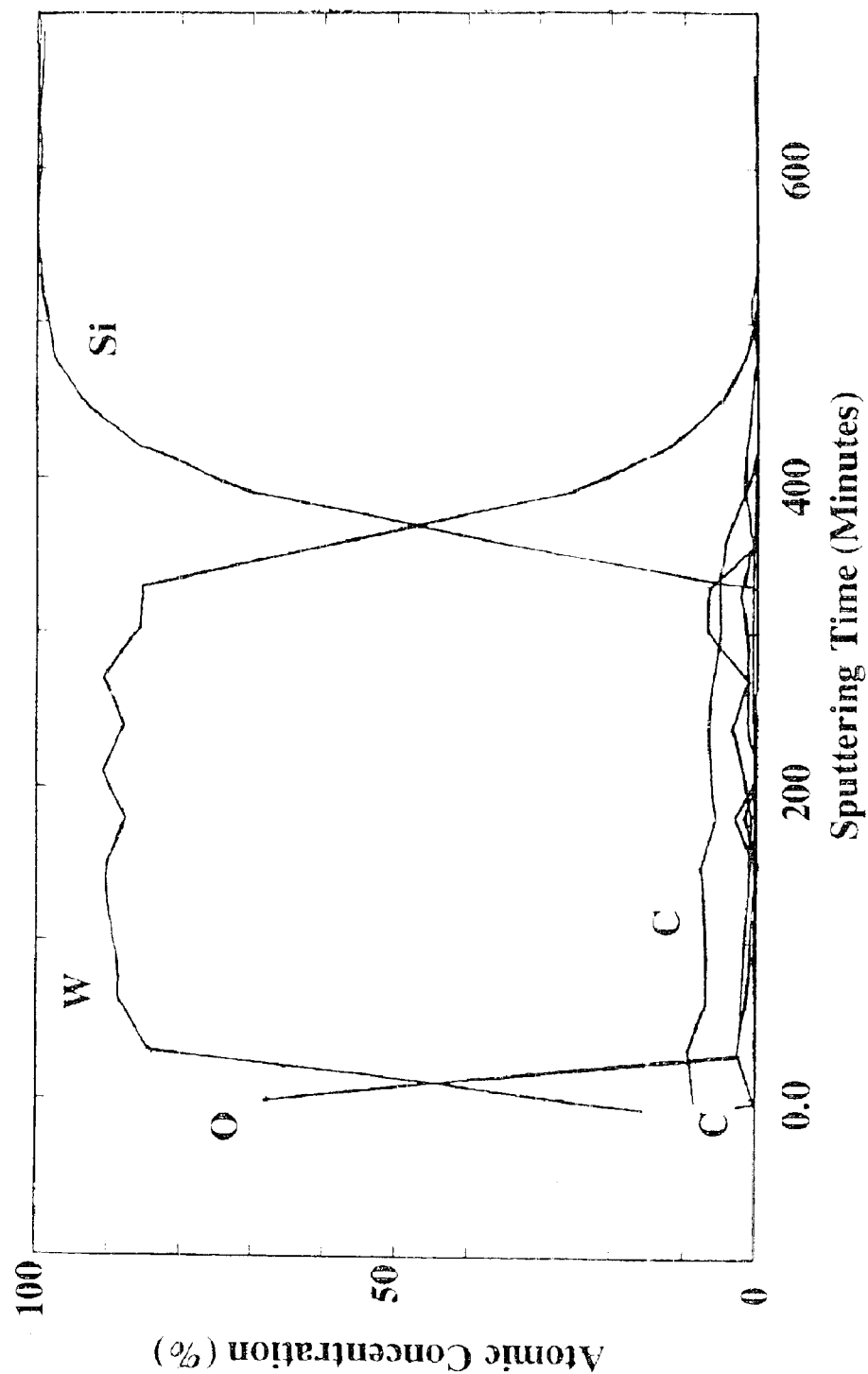
FIG. 12 is a representation of Auger electron spectra of the tungsten nitride films of Example 3.
Figure 13:
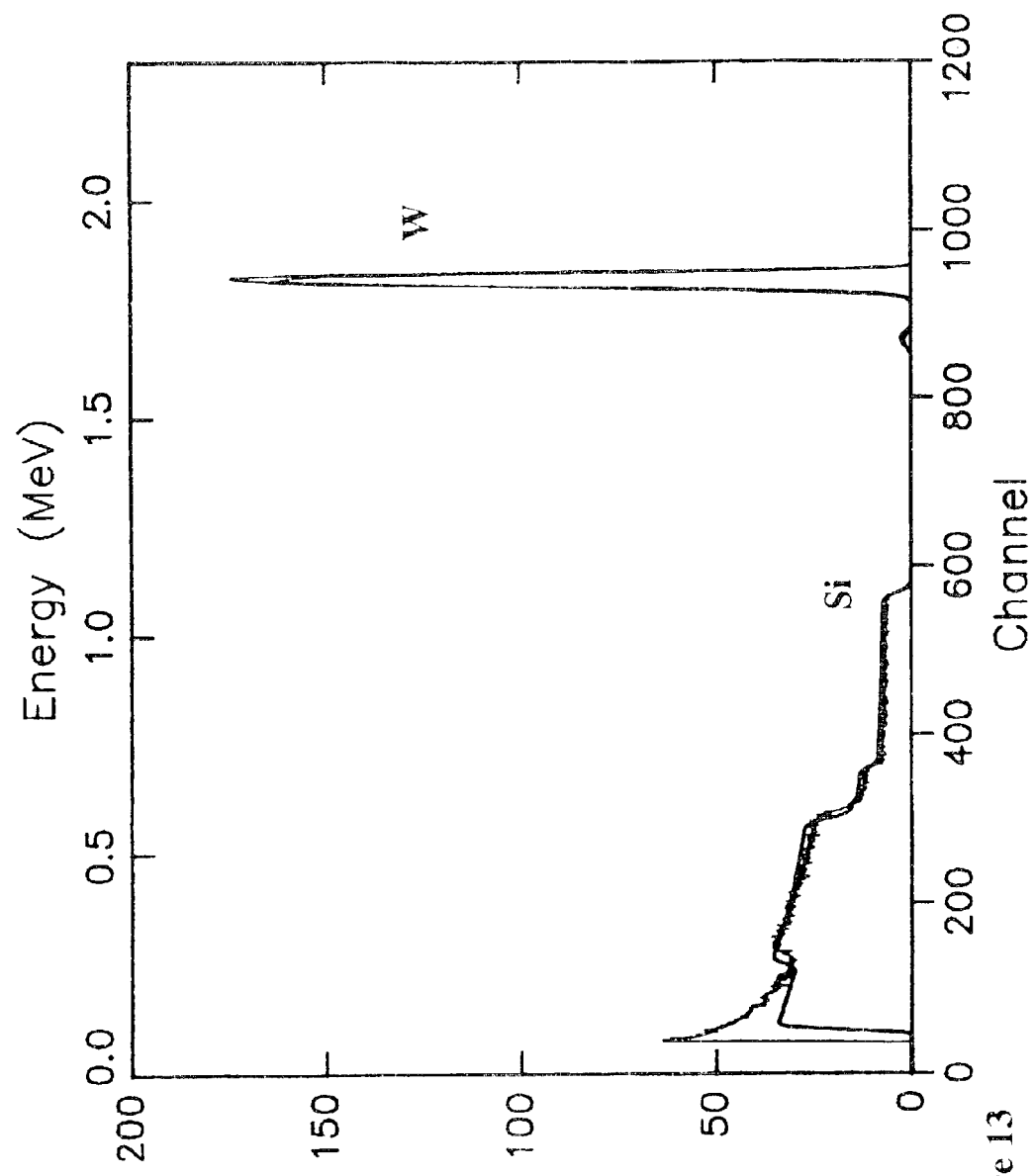
FIG. 13 is a representation of RBS spectra of the tungsten nitride films of Example 3.
Figure 14:
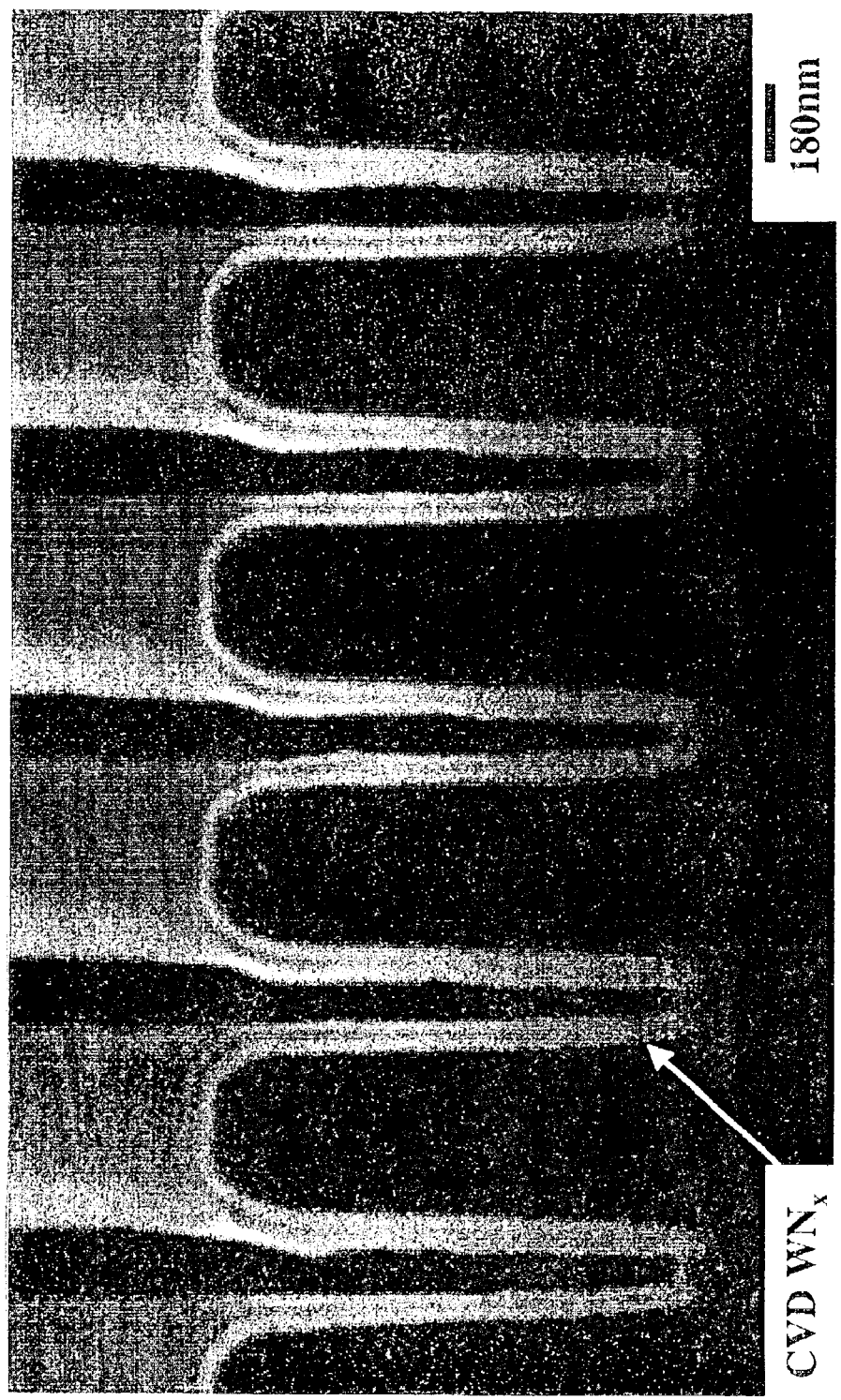
FIG. 14 is a representation of a typical cross section TEM-magnified view of a representative silicon substrate upon which oxide trench patterns, of nominal diameter 180 nm and 5:1 aspect ratio, are formed and upon which a representative sample of a the conformal tungsten nitride coating in accordance with Example 3 has been deposited.

W$_2$N conformality was studied using cross-section scanning electron microscopy (CS-SEM). CS-SEM was carried out on a Zeiss SDM940 microscope, employing a 20 keV primary electron beam and a beam current of 3.0 mA. Images taken by CS-SEM show step coverage of W$_2$N films to be better than 90% in nominal 0.25 μm trench structures, as demonstrated in the CS-SEM displayed in FIG. 6. In this case, step coverage was defined as the ratio of film thickness at the bottom of the structure to that in the field.

In summary, the low-temperature MOCVD process used in accordance with the present invention provided for the formation of tungsten nitride and tungsten nitride films for potential applications such as for a diffusion barrier in emerging copper-based metallization schemes among others. The process is based on the reaction of tungsten carbonyl compounds as tungsten nitride source precursors, preferably the non-fluorinated tungsten hexacarbonyl (W(CO)$_6$)) with a nitrogen-containing reactant gas such as ammonia (NH$_3$), and preferably in the presence of hydrogen (H$_2$). The tungsten nitride and tungsten nitride films formed in accordance with the present invention may be formed within a wide range of process parameters. Microstructural and microchemical analyses indicated that the tungsten nitride films were predominantly formed of a W$_2$N phase, with carbon and oxygen contamination levels of ≦5 at %, even at the lowest deposition temperature of 200° C. Films deposited below 275° C. were amorphous, while those deposited between 275° C. and 350° C. were polycrystalline. Resistivities as low as 123 μΩ/cm were achieved for 50 nm-thick films, with corresponding step coverage being higher than 90% in nominal 0.25 μm trench structures with an aspect ratio of 4:1. These results indicate that the MOCVD route to tungsten nitride using a preferred precursor according to the invention such as non-fluorinated tungsten hexacarbonyl provides a viable alternative to inorganic CVD from tungsten hexafluoride and ammonia, especially in terms of potential elimination of transport and handling concerns attributed to the high reactivity of the fluorinated tungsten hexafluoride source, and the reliability issues pertaining to the possible inclusion of fluorine in the tungsten hexafluoride-based CVD process due to the fast diffusion of the fluorine in metals such as copper.

EXAMPLE 2

In this Example, the same procedures were used as described above in Example 1 in detail with the exception that in this Example, thermal deposition of a number of tungsten nitride films was carried out using a stand-alone single module deposition chamber and reacting tungsten hexacarbonyl with ammonia in the presence of hydrogen gas. The reaction parameters are shown below in Table 2.

TABLE 2

| Parameter Name | Parameter in Example 2 |
| --- | --- |
| Substrate Temperature | 220° C. |
| Ammonia Flow Rate | 100 standard cm$^3$/min |
| Hydrogen Flow Rate | 50 standard cm$^3$/min |
| Process Pressure | 0.5 torr |
| Precursor Flow Rate | 18.7 standard cm$^3$/min |
| Deposition Rate | 2 nm/min |

Using the above parameters, the following tests as set forth in Table 3 below, which are described in further detail in Example 1 were carried out and demonstrate that amorphous W$_2$N films were formed with less than about 5 at % hydrogen, about 5–8 at % oxygen, and about 4–6 at % carbon. The relevant representative spectra for this Example are shown in FIGS. 7–10. Further, the resistivity was measured using a four point probe and found to range between 300–400 μΩ/cm. The RMS surface roughness and surface grain size was further measured using Atomic Force Microscopy (AFM) and found to be <5% of the film thickness.

TABLE 3

| Evaluation | Finding |
| --- | --- |
| Composition/Phase (XPS, AES, RBS) | W$_2$N |
| Carbon, Oxygen Inclusion (XPS, SIMS, RBS) | ~5–8 at % O<br>~4–6 at % C |
| Hydrogen Inclusion (Nuclear Reaction Analysis, SIMS*) | ~5 at % |
| Texture/Structure (XRD) | Amorphous |

TABLE 3-continued

| Evaluation | Finding |
| --- | --- |
| Resistivity (Four Point Probe) | 300–400 μΩ/cm |
| RMS Surface Roughness and Surface Grain Size | <5% Film Thickness |

*Secondary Ion Mass Spectroscopy

EXAMPLE 3

In this Example, the procedure of Example 1 was followed with the exception that thermal CVD of tungsten nitride films was undertaken using a cluster tool platform. The reactants were tungsten hexacarbonyl and ammonia. The reaction conditions are shown below in Table 4.

TABLE 4

| Parameter Name | Parameter in Example 3 |
| --- | --- |
| Substrate Temperature | 225° C. |
| Ammonia Flow Rate | 150 standard cm³/min |
| Hydrogen Flow Rate | — |
| Process Pressure | 0.5 torr |
| Precursor Flow Rate | 20 standard cm³/min |
| Deposition Rate | 4 nm/min |

The resulting films and coated substrates formed using the above parameters were tungsten nitride films of varied compositions within the formula $WN_x$ where $0.1 \leq x \leq 2.0$. The oxygen and carbon impurities were less than about 1–3 at % O and less than about 1–2 at % carbon with no hydrogen. The resulting phases of the different films varied from amorphous to amorphous with partial polycrystallinity in a β-phase. FIGS. 11–14 show the characteristics of the films. The resisitivities were measured to be low and in the 100–250 μΩ/cm range with a <5% of film thickness surface roughness and surface grain size (AFM). The parameters and characteristics of the films are summarized below in Table 5.

TABLE 5

| Evaluation | Finding |
| --- | --- |
| Composition/Phase (XPS, AES, RBS) | $WN_x$ (0.1 ≤ x ≤ 2.0) |
| Carbon/Oxygen Inclusion (XPS, SIMS, RBS) | ~1–3 at % O<br>~1–2 at % C |
| Hydrogen Inclusion (Nuclear Reactive Analysis, SIMS) | 0% |
| Texture (XRD) | amorphous or partly polycrystalline β-phase |
| Resistivity (Four Point Probe) | 100–250 μΩ/cm |
| RMS Surface Roughness and Surface Grain Size (AFM) | <5% of Film Thickness |

As the above disclosure and examples demonstrate, applicants have developed a process for forming tungsten nitride and tungsten nitride films, as well as tungsten nitride precursors and tungsten nitride vapor deposition processes which allow for excellent coating, barrier and liner properties. Tungsten nitride films formed at low-temperature MOCVD processes, including various CVD methods, or in accordance with the ALCVD method of the present invention are capable of being produced in a wide process window, including substrate temperatures of up to 600° C., preferably from about 200° C. to about 350° C., at tungsten nitride precursor flow rates of from about 1 to about 20 standard cm³/min, nitrogen-containing reactant gas flow rates of from about 100 to about 500 standard cm³/min and reactor pressures of from about 0.2 to about 0.5 torr.

The resulting tungsten nitride and tungsten nitride films demonstrate predominantly $W_2N$ phase, with carbon and oxygen contamination levels of typically ≦5 at %, even at the lowest deposition temperatures. Films deposited between 200° C. and about 275° C. are amorphous in nature while those deposited between about 275° C. and 350° C. were more polycrystalline in nature. Resistivities as low as 123 μΩ/cm were achieved in 50 nm-thick films, with corresponding step coverage being higher than 90% in nominal 0.25 μm trench structures with aspect ratio of 4:1. Such results indicate that the MOCVD and/or the ALCVD process of this invention may be used to form $W_2N$ films using tungsten carbonyl compounds which are preferably non-fluorinated and provide a viable alternative to inorganic CVD using fluorinated tungsten hexafluoride. This is particularly significant in view of the potential elimination of transport and handling concerns attributed to the high reactivity of the fluorinated tungsten hexafluoride source and reliability issues pertaining to the possible inclusion of fluorine, a fast diffuser in metals such as copper, in tungsten hexafluoride processes. The films of the invention further provide consistent film properties which are important particularly in microelectronic applications, including uniform electrical properties, stress free coatings, uniform lattice parameters or an amorphous structure. Such films also provide such benefits without damaging structures by exposure to high temperatures or corrosive byproducts

EXAMPLE 4

In this Example, ALCVD was carried out using $W(CO)_6$, $NH_3$ and argon as, respectively, the source precursor, reactant and purging gas. The corresponding experimental conditions are summarized in Table 6 below.

TABLE 6

| Parameter | Values Of Parameters During Formation of Tungsten Nitride Films |
| --- | --- |
| $W(CO)_6$ Source Temperature | 85–100° C. |
| Wafer Temperature | 125–275° C. |
| Reactor Base Pressure | ~10⁻⁶ torr |
| Reactor Process Pressure | 0.2–0.5 torr |
| Precursor Flow Rate | 1–20 standard cm³/min |
| Purge Gas (Argon) Flow Rate | 50–500 standard cm³/min |
| Ammonia Flow Rate | 100–500 standard cm³/min |
| Precursor Pulse Time | 30 seconds to 2 minutes |
| Purge Gas (Argon) Flow Rate | 20 seconds to 3 minutes |
| Ammonia Flow Rate | 30 seconds to 2 minutes |

Figure 15:
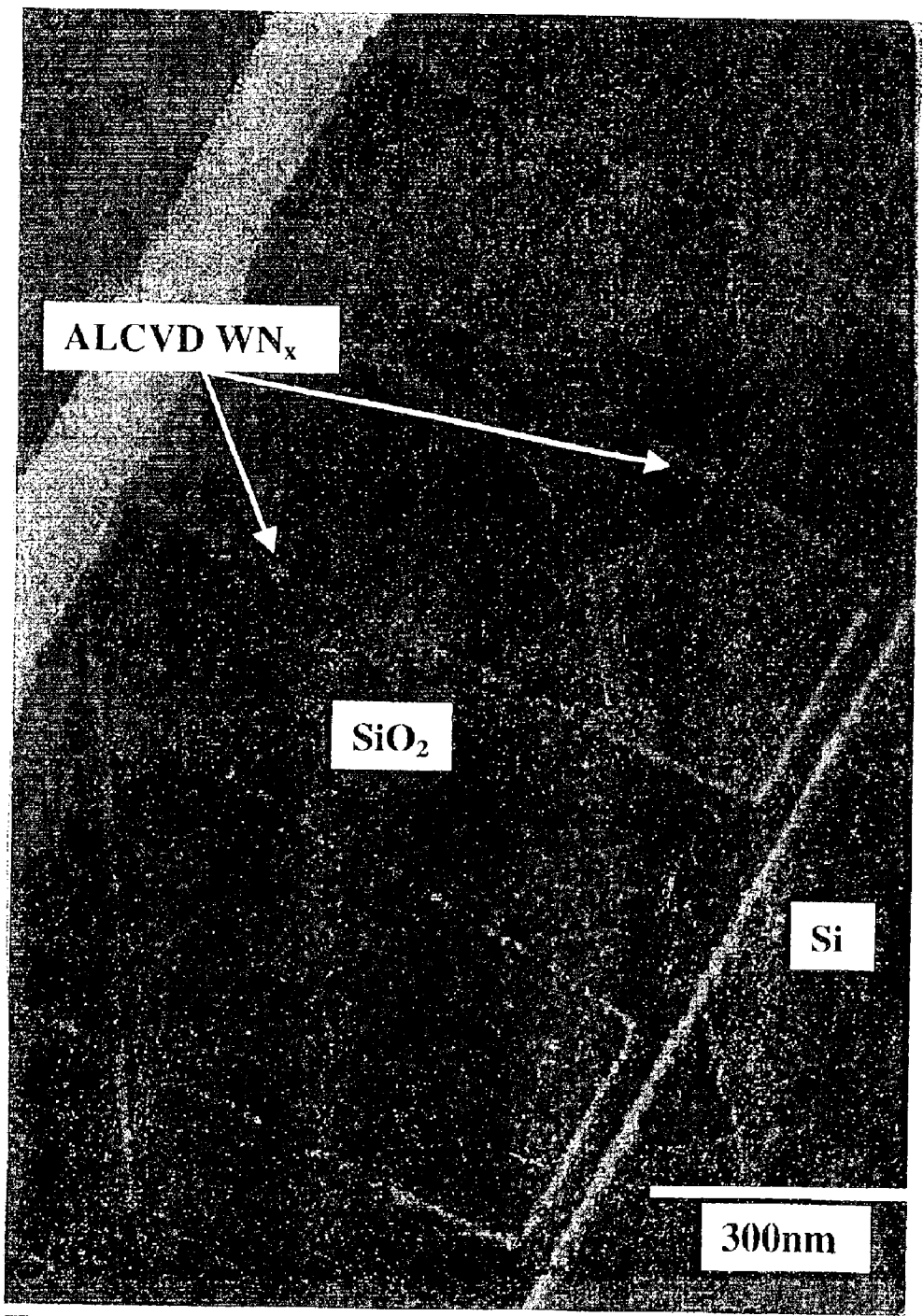
FIG. 15 is a representation of a typical cross-section TEM-magnified view of a representative silicon substrate upon which oxide trench patterns, of nominal diameter 300 nm and 4:1 aspect ratio are formed and upon which are conformal tungsten nitride coatings of Example 4.

The resulting tungsten nitride films exhibited structural, electrical, and compositional properties similar to those listed in Table 5. Step coverage was nearly 100% in 300 nm-wide, 4:1 aspect ratio, trench structures, as shown in the typical TEM micrograph of FIG. 15.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A process for the production of tungsten nitride comprising reacting a tungsten carbonyl compound with a nitrogen-containing gas in a deposition chamber at a temperature below about 600° C., wherein the tungsten carbonyl compound is introduced into the chamber in a vapor state separately from the introduction of the nitrogen-containing gas prior to reacting the tungsten carbonyl compound and the nitrogen-containing gas.

2. A process for the production of tungsten nitride according to claim 1, wherein the nitrogen-containing gas is ammonia.

3. The process for the production of tungsten nitride according to claim 1, wherein the tungsten nitride has a formula $WN_x$, wherein $0.1 \leq x \leq 2.0$.

4. The process for the production of tungsten nitride according to claim 1, wherein the nitrogen-containing gas is ammonia and the process further comprises reacting the tungsten carbonyl compound with the ammonia in the presence of hydrogen.

5. The process for the production of tungsten nitride according to claim 1, wherein the temperature is from about 200° C. to about 350° C.

6. The process for the production of tungsten nitride according to claim 5, wherein the temperature is from about 200° C. to about 275° C.

7. The process for the production of tungsten nitride according to claim 1, wherein the tungsten carbonyl compound is a compound according to formula (I):

$$W(CO)_{(6-n)}X_n \quad \quad (I)$$

wherein X is a two-electron donor or a ligand selected from the group consisting of ammonia, amine, carbonyl and halogen, and n is 0 or 1.

8. A process for the production of a tungsten nitride film comprising reacting a tungsten carbonyl compound with a nitrogen-containing gas in a deposition chamber having a substrate, wherein the substrate temperature is from about 200° C. to about 600° C., wherein the tungsten carbonyl compound is introduced into the chamber in a vapor state separately from the introduction of the nitrogen-containing gas prior to reacting the tungsten carbonyl compound and the nitrogen-containing gas.

9. The process for the production of tungsten nitride film according to claim 8, wherein the substrate temperature is from about 200° C. to about 275° C. and the tungsten nitride film is amorphous.

10. The process for the production of a tungsten nitride film according to claim 8, wherein the tungsten nitride film has a formula $WN_x$, wherein $0.1 \leq x \leq 2.0$.

11. The process for the production of a tungsten nitride film according to claim 8, wherein the tungsten carbonyl compound has the following formula (I):

$$W(CO)_{(6-n)}X_n \quad \quad (I)$$

wherein X is a two-electron donor or a ligand selected from the group consisting of ammonia, amine, carbonyl and halogen, and n is 0 or 1.

12. A process for the chemical vapor deposition of a tungsten nitride film onto a substrate, comprising:
  (a) introducing into a deposition chamber:
    (i) a substrate
    (ii) a tungsten carbonyl compound in a vapor state; and
    (iii) at least one nitrogen-containing gas; and
  (b) maintaining a substrate temperature of from about 200° C. to about 600° C. for a period of time sufficient to deposit a tungsten nitride film on the substrate, wherein the tungsten carbonyl compound is introduced into the deposition chamber separately from the nitrogen-containing gas prior to reacting the tungsten carbonyl compound and the nitrogen-containing gas.

13. The process for the chemical vapor deposition of a tungsten nitride film onto a substrate according to claim 12, wherein the tungsten carbonyl compound has the following formula (I):

$$W(CO)_{(6-n)}X_n \quad \quad (I)$$

wherein X is a two-electron donor or a ligand selected from the group consisting of ammonia, amine, carbonyl and halogen, and n is 0 or 1.

14. The process for the chemical vapor deposition of a tungsten nitride film onto a substrate according to claim 13, wherein the nitrogen-containing gas is ammonia.

15. The process for the chemical vapor deposition of a tungsten nitride film onto a substrate according to claim 14, further comprising introducing hydrogen to the deposition chamber.

16. The process for the chemical vapor deposition of a tungsten nitride film onto a substrate according to claim 13, wherein the substrate temperature is from about 200° C. to about 350° C.

17. The process for the chemical vapor deposition of a tungsten nitride film onto a substrate according to claim 16, wherein the substrate temperature is from about 200° C. to about 250° C.

* * * * *